United States Patent
Kami et al.

(10) Patent No.: US 12,429,786 B2
(45) Date of Patent: Sep. 30, 2025

(54) ELECTRONIC DEVICE AND METHOD FOR PRODUCING THE SAME, IMAGE FORMING METHOD, AND IMAGE FORMING APPARATUS

(71) Applicants: Hidetoshi Kami, Shizuoka (JP); Tomoharu Asano, Kanagawa (JP); Masayuki Ishii, Shizuoka (JP); Ryota Inoue, Shizuoka (JP)

(72) Inventors: Hidetoshi Kami, Shizuoka (JP); Tomoharu Asano, Kanagawa (JP); Masayuki Ishii, Shizuoka (JP); Ryota Inoue, Shizuoka (JP)

(73) Assignee: Ricoh Company, Ltd., Tokyo (JP)

( * ) Notice: Subject to any disclaimer, the term of this patent is extended or adjusted under 35 U.S.C. 154(b) by 849 days.

(21) Appl. No.: 17/753,668

(22) PCT Filed: Jul. 21, 2020

(86) PCT No.: PCT/JP2020/028343
§ 371 (c)(1),
(2) Date: Mar. 10, 2022

(87) PCT Pub. No.: WO2021/059712
PCT Pub. Date: Apr. 1, 2021

(65) Prior Publication Data
US 2022/0342327 A1    Oct. 27, 2022

(30) Foreign Application Priority Data

Sep. 26, 2019 (JP) ................................. 2019-174926
May 8, 2020 (JP) ................................. 2020-082368

(51) Int. Cl.
*G03G 5/147* (2006.01)
*G03G 5/05* (2006.01)

(52) U.S. Cl.
CPC ....... *G03G 5/14704* (2013.01); *G03G 5/0525* (2013.01)

(58) Field of Classification Search
CPC .................. G03G 5/14704; G03G 5/0525
See application file for complete search history.

(56) References Cited

U.S. PATENT DOCUMENTS

| 8,771,910 B2 | 7/2014 | Fujita et al. |
| 11,287,756 B2* | 3/2022 | Nagao ................ G03G 5/14765 |

(Continued)

FOREIGN PATENT DOCUMENTS

| CN | 101004561 A | 7/2007 |
| CN | 108205245 A | 6/2018 |

(Continued)

OTHER PUBLICATIONS

International Search Report Issued Nov. 2, 2020 for counterpart International Patent Application No. PCT/JP2020/028343 filed Jul. 21, 2020.

(Continued)

*Primary Examiner* — Mark F. Huff
*Assistant Examiner* — Boone Alexander Evans
(74) *Attorney, Agent, or Firm* — Grüneberg and Myers PLLC

(57) ABSTRACT

An electronic device includes: a support; a charge-transporting layer including a charge-transporting material, or a sensitizing-dye electrode layer including a sensitizing dye, where the charge-transporting layer or the sensitizing-dye electrode layer is disposed on or above the support; and a metal oxide layer disposed on or above the charge-transporting layer or the sensitizing-dye electrode layer. The metal oxide layer includes p-type semiconductor metal oxide and silica or metal oxide particles, and an amount of the silica or metal oxide particles included in the metal oxide (Continued)

layer is 0.5% by mass or greater but 1.5% by mass or less, relative to the metal oxide layer.

6 Claims, 7 Drawing Sheets

(56) References Cited

U.S. PATENT DOCUMENTS

| | | | |
|---|---|---|---|
| 2007/0059618 A1 | 3/2007 | Kurimoto et al. | |
| 2007/0269729 A1* | 11/2007 | Ikuno | G03G 5/0677 430/66 |
| 2008/0176154 A1* | 7/2008 | Gyoutoku | G03G 5/144 430/59.1 |
| 2009/0162097 A1 | 6/2009 | Fuchigami | |
| 2013/0157182 A1 | 6/2013 | Fujita et al. | |
| 2015/0261107 A1 | 9/2015 | Kodama et al. | |
| 2016/0129432 A1 | 5/2016 | Ozaki et al. | |
| 2017/0277050 A1 | 9/2017 | Yumita et al. | |
| 2018/0173120 A1 | 6/2018 | Horiguchi et al. | |
| 2021/0003931 A1 | 1/2021 | Kubo et al. | |

FOREIGN PATENT DOCUMENTS

| | | |
|---|---|---|
| JP | 2000-150166 | 5/2000 |
| JP | 2000-328223 | 11/2000 |
| JP | 2003-245997 | 9/2003 |
| JP | 2006-013097 | 1/2006 |
| JP | 4086627 | 2/2008 |
| JP | 2008-201004 | 9/2008 |
| JP | 2009-280854 | 12/2009 |
| JP | 2010-095790 | 4/2010 |
| JP | 2013-088390 | 5/2013 |
| JP | 2014-021133 | 2/2014 |
| JP | 5664538 | 12/2014 |
| JP | 2016-114902 | 6/2016 |
| JP | 2016-530908 | 10/2016 |
| JP | 6024689 | 10/2016 |
| JP | 2019-164322 | 9/2019 |
| WO | WO2006/054397 A1 | 5/2006 |

OTHER PUBLICATIONS

Written Opinion Issued Nov. 2, 2020 for counterpart International Patent Application No. PCT/JP2020/028343 filed Jul. 21, 2020.
Taiwanese Office Action issued Jan. 12, 2021 (mailed Jan. 14, 2021) for corresponding Taiwanese Application No. 109124826.
Taiwanese Office Rejection Decision issued Aug. 25, 2021 (mailed Aug. 26, 2021) for corresponding Taiwanese Application No. 109124826.

\* cited by examiner

ELECTRONIC DEVICE AND METHOD FOR PRODUCING THE SAME, IMAGE FORMING METHOD, AND IMAGE FORMING APPARATUS

CROSS-REFERENCE TO RELATED APPLICATIONS

This application is the National Stage entry under § 371 of International Application No. PCT/JP2020/028343, filed on Jul. 21, 2020, and which claims the benefit of priority to Japanese Application No. 2019-174926, filed on Sep. 26, 2019; and priority to Japanese Application No. 2020-082368, filed on May 8, 2020. The content of each of these applications is hereby incorporated by reference in its entirety.

TECHNICAL FIELD

The present disclosure relates to an electronic device and a method for producing the electronic device, an image forming method, and an image forming apparatus.

BACKGROUND ART

In recent years, photoelectric conversion devices including organic semiconductors have been developed and have been available on the market.

Currently, widely available photoelectric conversion devices, such as electrophotographic photoconductors, are mostly organic electronic devices formed of organic materials. However, an organic electronic device has a problem that the organic electronic device has a shorter service life compared with an inorganic electronic device. One of the reasons for the short service life is poor gas barrier properties due to an organic material included in the organic electronic device. Compared to a dense film of an inorganic material, a resin film of an organic material has many gaps. Therefore, food wrapping materials, such as polypropylene (PP), are laminated with aluminium to enhance weather resistance of contents.

As a low cost organic solar cell compared with a silicon-based solar cell, a dye-sensitized solar cell including an organic sensitizing dye has been developed.

Since the dye-sensitized solar cell includes an organic sensitizing dye that is an organic material, however, materials for use tend to be deteriorated by a temperature, humidity, and gas (e.g., oxygen, ozone, NOx, ammonia) compared with a silicon-based solar cell, and therefore functions of the dye-sensitized solar cell tend to de degraded. Therefore, the dye-sensitized solar cell has a problem that it is poor in durability compared with a silicon-based solar cell.

In a display element, such as an organic electroluminescent (EL) element, a light-emitting diode display element, a liquid crystal display element, and an electrophoretic ink display element, a display element, such as an organic EL layer sandwiched between a positive electrode and a negative electrode, is laminated on a substrate. Compared with a liquid crystal display device, an organic EL display device has a wide angle of view and high response speed, and therefore is expected to be a display device of the next generation because of diversity of luminescence organic materials have.

As a formation method of organic EL elements, a formation method using coating is used in view of productivity and cost. Moreover, organic EL element tend to deteriorate as a result of exposure to heat or gas, such as moisture and oxygen. As a result, there is a problem that organic EL elements have a short service life.

There has been an attempt to enhance gas barrier properties to extend a service life of an organic electronic device, such as an electrophotographic photoconductor for a printer, a dye-sensitized solar cell, and an organic EL element. However, the number of processes is large, which adversely affect an organic electronic device, and therefore there is a room for an improvement in a balance between cost and durability.

As an electrophotographic photoconductor having excellent abrasion resistance and stability of image properties, for example, proposed is an electrophotographic photoconductor including a protective layer that includes a p-type semiconductor particles treated with a surface treating agent (see, for example, PTL 1).

As an organic EL element, which has a long service life, improved efficiency, and low driving voltage, for example, proposed is an organic EL element, in which an organic hole-transporting layer of the organic EL element is replaced with an inorganic p-type semiconductor (see, for example, PTL 2).

Moreover, proposed is a laminate, in which a particulate material of 100 micrometers or smaller, such as a ceramic material and a metal material, is formed into a film on a substrate by aerosol deposition to form a polycrystalline brittle material layer (see, for example, PTL 3).

Gas barrier properties can be enhanced by disposing metal oxide including a p-type semiconductor as a surface layer. As film formation of the metal oxide, aerosol deposition having excellent mass productivity is suitably used. When flowability of a raw material powder is poor, film formation of the metal oxide tends to be uneven, and process capability is insufficient, and therefore mass production thereof as an industrial products may not be achieved.

CITATION LIST

Patent Literature

PTL 1: Japanese Patent No. 5664538
PTL 2: Japanese Unexamined Patent Application Publication No. 2000-150166
PTL 3: Japanese Unexamined Patent Application Publication No. 2008-201004

SUMMARY OF INVENTION

Technical Problem

The present disclosure has an object to provide an electronic device that can suppress unevenness in film formation of a metal oxide layer, and has high uniformity in a thickness of the metal oxide layer.

Solution to Problem

According to one aspect of the present disclosure, an electronic device including: a support; a charge-transporting layer including a charge-transporting material, or a sensitizing-dye electrode layer including a sensitizing dye, where the charge-transporting layer or the sensitizing dye electrode layer is disposed on or above the support; and a metal oxide layer disposed on or above the charge-transporting layer or the sensitizing-dye electrode layer, wherein the metal oxide layer includes p-type semiconductor metal oxide and silica or metal oxide particles, and an amount of the silica or metal oxide particles included in the metal oxide layer is 0.5% by mass or greater but 1.5% by mass or less relative to the metal oxide layer.

Advantageous Effects of Invention

The present disclosure can provide an electronic device that can suppress unevenness in film formation of a metal oxide layer, and has high uniformity in a thickness of the metal oxide layer.

DESCRIPTION OF EMBODIMENTS

<Electronic Device>

The electronic device of the present disclosure includes a support, a charge-transporting layer including a charge-transporting material or a sensitizing-dye electrode layer including a sensitizing dye, where the charge-transporting layer or the sensitizing-dye electrode layer is disposed on or above the support, and a metal oxide layer disposed on or above the charge-transporting layer or the sensitizing-dye electrode layer. The metal oxide layer includes p-type semiconductor metal oxide and silica or metal oxide particles. An amount of the silica or metal oxide particles included in the metal oxide layer is 0.5% by mass or greater but 1.5% by mass or less relative to the metal oxide layer.

The electronic device is not particularly limited and may be appropriately selected depending on the intended purpose. Examples of the electronic device include devices, such as an electrophotographic photoconductor, a solar cell, an organic electroluminescent (EL) element, a transistor, an integrated circuit, a laser diode, and a light emitting diode.

Moreover, the electronic device of the present disclosure has been accomplished based on the following insights. That is, there is a case where an electronic device known in the art may not have high uniformity in a thickness of a metal oxide layer (less variations in the thickness) with suppressing unevenness in film formation of the metal oxide layer.

According to film formation of metal oxide including p-type semiconductor using aerosol deposition known in the art, formation of the metal oxide tends to be uneven when flowability of a raw material powder is poor, and process capability is insufficient, and therefore mass production thereof as an industrial products may not be achieved.

The present disclosure includes metal oxide layer on a charge-transporting layer or a sensitizing dye-electrode layer, where the metal oxide layer includes metal oxide including a p-type semiconductor and silica or metal oxide particles. Therefore, unevenness of film formation of the metal oxide layer can be suppressed, and an electronic device having high uniformity in a thickness of the metal oxide layer with suppressing unevenness in film formation can be provided.

Figure 1:
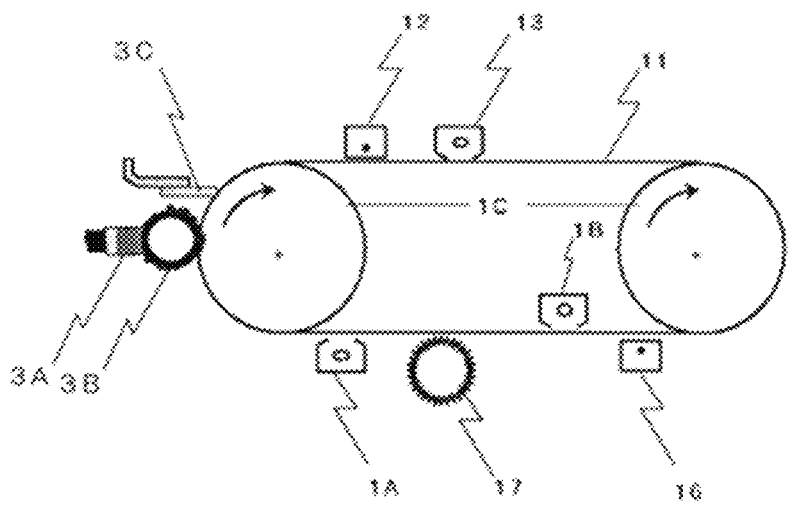
FIG. 1 is a schematic structural view illustrating one example of an image forming apparatus of the present disclosure.
Figure 10A:
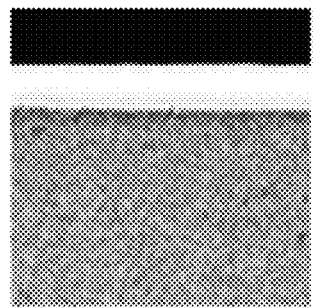
FIG. 10A is a photograph depicting one example of a film-formed ceramic.
Figure 10B:
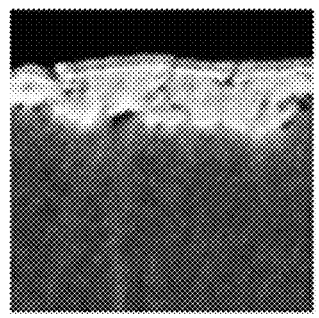
FIG. 10B is a photograph depicting one example of a film-formed ceramic.
Figure 10C:
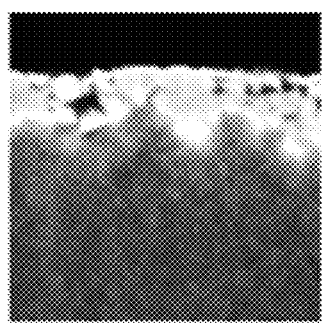
FIG. 10C is a photograph depicting one example of a film-formed ceramic.

In the proposal in PTL 1 (Japanese Patent No. 5664538), a protective layer includes a ceramic as a p-type semiconductor, but the ceramic is not in the form of a film, but a particulate semiconductor. FIG. 1 of PTL 1 illustrates a conceptual view in which a particulate semiconductor is dispersed in a protective layer. The film form here denotes an embodiment of the whitest surface layer seen in FIGS. 10A, 10B, and 10C.

PTL2 (Japanese Unexamined Patent Application Publication No. 2000-150166) does not disclose use of a hole-transporting layer including an inorganic p-type semiconductor, but PTL 2 does not disclose that the hole-transporting layer includes silica. In the proposal of PTL 3 (Japanese Unexamined Patent Application Publication No. 2008-201004), a dense polycrystalline brittle material layer formed of particles is formed, but PTL 3 does not disclose that silica is included in the particles.

<Metal Oxide Layer>

The metal oxide layer includes p-type semiconductor metal oxide and silica or metal oxide particles. In the present disclosure, the p-type semiconductor metal oxide is preferably delafossite oxide.

<<Delafossite Oxide>>

The delafossite oxide (may be referred to as a "p-type semiconductor," or "p-type metal compound semiconductor" hereinafter) is not particularly limited and may be appropriately selected depending on the intended purpose, as long as the delafossite oxide has a function as a p-type semiconductor. Examples of the delafossite oxide include a p-type metal oxide semiconductor, a p-type metal compound semiconductor including monovalent copper, and other p-type metal compound semiconductors.

Examples of the p-type metal oxide semiconductor include $CoO$, $NiO$, $FeO$, $Bi_2O_3$, $MoO_2$, $MoS_2$, $Cr_2O_3$, $SrCu_2O_2$, and $CaO-Al_2O_3$.

Examples of the p-type metal compound semiconductor including monovalent copper include $CuI$, $CuInSe_2$, $Cu_2O$, $CuSCN$, $CuS$, $CuInS_2$, $CuAlO$, $CuAlO_2$, $CuAlSe_2$, $CuGaO_2$, $CuGaS_2$, and $CuGaSe_2$.

Examples of other p-type metal compound semiconductors include $GaP$, $GaAs$, $Si$, $Ge$, and $SiC$.

Among the above-listed examples, copper aluminium oxide, such as $CuAlO$ and $CuAlO_2$, is are preferable in view of charge mobility and light transparency.

<<Silica>>

The silica included in the metal oxide layer of the present disclosure may be appropriately synthesized for use, or may be selected from commercial products. Examples of the commercial products include REOLOSIL ZD-30S (available from Tokuyama Corporation), HDK H-2000 (available from Wacker Asahikasei Silicone Co., Ltd.), and AEROSIL R976 and AEROSIL RA200HS (available from NIPPON AEROSIL CO., LTD.).

The silica is preferably in the form of particles. The volume average particle diameter of the silica particles is preferably 1 micrometer or greater but 50 micrometers or less.

The average particle diameter of the silica particles can be measured by means of a particle size distribution analyzer MT3300EX, available from MicrotracBEL Corp., etc.

An amount of the silica included in the metal oxide layer is 0.5% by mass or greater but 1.5% by mass or less, and preferably 0.7% by mass or greater but 1.3% by mass or less, relative to the metal oxide layer. When the amount of the silica is within the above-mentioned range, unevenness in film formation of the metal oxide layer can be suppressed, and an electronic device having high uniformity in a thickness of the metal oxide layer can be obtained.

<<Metal Oxide Particles>>

Examples of the metal oxide particles included in the metal oxide layer of the present disclosure include aluminium oxide, barium titanate, chromium oxide, copper oxide, iron oxide, magnesium oxide, manganese oxide, strontium titanate, tin oxide, titanium oxide, zinc oxide, and zirconium oxide.

The metal oxide particles may be appropriately synthesized for use, or may be selected from commercial products. Examples of the commercial products include aluminium oxide AKP-50 (available from SUMITOMO CHEMICAL COMPANY, LIMITED), aluminium oxide AKP-20 (available from SUMITOMO CHEMICAL COMPANY, LIMITED), aluminium oxide TM-DAR (available from TAIMEI CHEMICALS CO., LTD.), and zinc oxide SF-10 (available from SAKAI CHEMICAL INDUSTRY CO., LTD.).

The volume average particle diameter of the metal oxide particles is preferably from 1/100 through 1/10 of the size of the metal oxide particles (base particles) having p-type semiconductor, and is more preferably 1 micrometer or greater but 3 micrometers or less.

The volume average particle diameter of the metal oxide particles can be measured by the same method to the measurement method of the silica particles.

An amount of the metal oxide particles included in the metal oxide layer is 0.5% by mass or greater but 1.5% by mass or less, and preferably 0.7% by mass or greater but 1.3% by mass or less, relative to the metal oxide layer. When the amount of the metal oxide particles is within the above-mentioned range, unevenness in film formation of the metal oxide layer can be suppressed, and an electronic device having high uniformity in a thickness of the metal oxide layer can be obtained.

<<Thickness of Metal Oxide Layer>>

In the present disclosure, the average thickness of the metal oxide layer is preferably 1.2 micrometers or greater but 1.8 micrometers or less. More preferably, the average thickness of the metal oxide layer is 1.2 micrometers or greater but 1.8 micrometers or less, and a standard deviation of a thickness of the metal oxide layer is 0.07 micrometers or less.

In case of an electrophotographic photoconductor that is an embodiment of the electrochromic device of the present disclosure, for example, a thickness of the photoconductor is measured at 5 points of a cylindrical photoconductor drum having a length of 380 mm and an outer diameter of 100 mm, where the 5 points are taken in the length direction from a position that is 100 mm from the edge of the photoconductor drum to a position that is 300 mm from the edge thereof at interval of 50 mm. The above-described measurement of the thickness is performed on 20 photoconductor drums, to obtain thickness data of 100 points in total. The measurement of the thickness is performed by a method using light interference according to Japanese Patent No. 5521607. The standard deviation is determined as well as determining the thickness from the average value of the obtained data.

When the average thickness of the metal oxide layer is 1.2 micrometers or greater but 1.8 micrometers or less, it is advantageous because a high quality print image having an excellent balance between abrasion resistance and electrostatic properties, and long service life can be formed. When the standard deviation of the thickness of the metal oxide layer is 0.07 micrometers or less, moreover, it is advantageous because a print image having excellent reproducibility of gradation that affects appearance of the print image of human skin or scenery.

<<Process Capability>>

Moreover, a process capability index Cpk is calculated from the obtained average value of the thickness and the standard deviation according to the equations (1) to (3) below. The process capability index is a value evaluating a degree of a shift of the arithmetic average value X of the thickness from the median value of the standard. The larger Cpk means the higher capability of producing electronic devices of stable quality.

[Math. 1]
$$Cpk = Cp(1-K) \tag{1}$$

[Math. 2]
$$Cp = \frac{USL - LSL}{6\sigma} \tag{2}$$

[Math. 3]
$$K = \frac{\left|\left(\frac{USL + LSL}{2}\right) - X\right|}{\left(\frac{USL - LSL}{2}\right)} \tag{3}$$

In the equations above, USL is the upper limit value of the standard, LSL is the lower limit value of the standard, X is the arithmetic average value of the thickness, and $\sigma$ is the standard deviation. Moreover, Cp is a comparison between $6\sigma$ indicating variations in a film formation process, and the standard width.

<Production of Metal Oxide Layer>

A production method (film formation method) of the metal oxide layer is not particularly limited and may be appropriately selected from typically used film formation methods of inorganic materials. Examples thereof include a vapor deposition method, a liquid phase growth method, and a solid phase growth method.

The vapor deposition method is classified, for example, into a physical vapor deposition method (PVD) and a chemical vapor deposition method (CVD).

Examples of the physical vapor deposition method include vacuum vapor deposition, electron beam vapor deposition, laser abrasion, laser abrasion MBE, MOMBE, reactive vapor deposition, ion plating, cluster ion beam, glow discharge sputtering, ion beam sputtering, and reactive sputtering.

Examples of the chemical vapor deposition method include thermal CVD, MOCVD, RF plasma CVD, ECR plasma CVD, photo CVD, and laser CVD.

Examples of the liquid phase growth method include LPE, electroplating, electroless plating, and coating.

Examples of the solid phase growth method include SPE, recrystallization, graphoepitaxy, the LB method, the sol-gel method, and aerosol deposition (AD). Among the above-listed examples, AD is preferable because AD does not adversely affect uniform film formation of a film of a relatively large area, such as an electrophotographic photoconductor or properties of the electrophotographic photoconductor.

<<Aerosol Deposition (AD)>>

The aerosol deposition (AD) is a technique where particles or microparticles prepared in advance are mixed with gas to form aerosol, and the aerosol is jetted via a nozzle to a film formation target (substrate) to form a film.

As characteristics of the AD, film formation can be performed in a room temperature environment, and film formation can be performed in a state where a crystal structure of a raw material are maintained substantially the same. Therefore, the AD is suitable for film formation performed on an electronic device (particularly an electrophotographic photoconductor).

A method for forming the metal oxide layer according to the aerosol deposition will be described.

Figure 9:
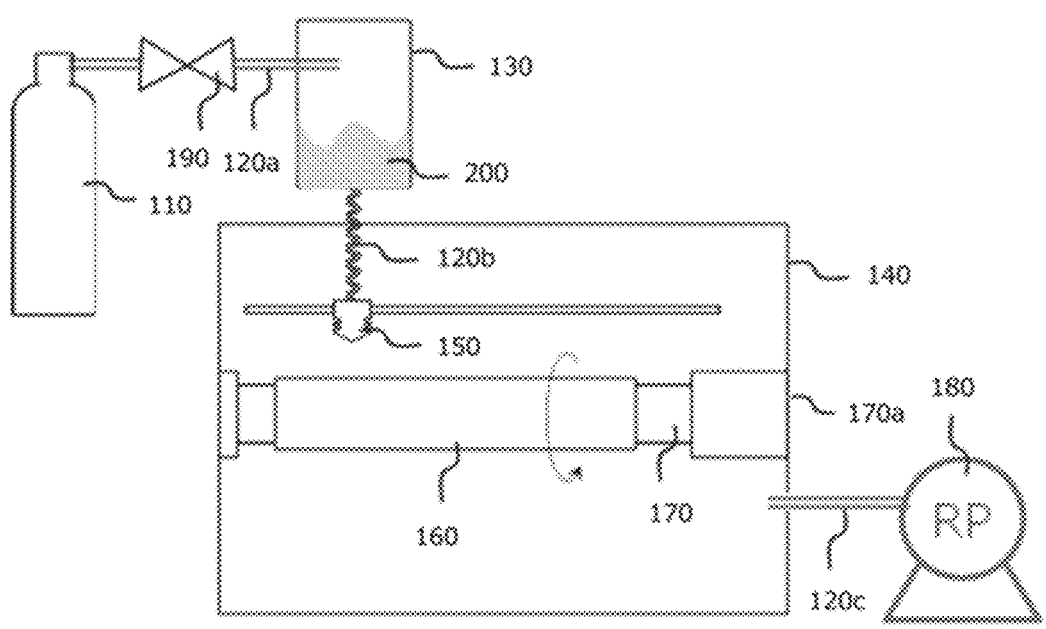
FIG. 9 is a schematic structural view illustrating one example of an aerosol deposition device used for forming a metal oxide layer of the present disclosure.

In this method, an aerosol deposition device as illustrated in FIG. 9 is used. A gas cylinder 110 illustrated in FIG. 9 stores inert gas for generating aerosol. The gas cylinder 110 is linked to an aerosol generator 130 via a pipe 120a, and the pipe 120a is guided inside the aerosol generator 130. A certain amount of particles 200 formed of metal oxide or a compound semiconductor is placed inside the aerosol generator 130. Another pipe 120b linked to the aerosol generator 130 is coupled with a jet nozzle 150 inside a film formation chamber 140.

In the present disclosure, the particles 200 formed of p-type semiconductor metal oxide and silica are introduced into the aerosol generator 130 and aerosol is generated, and the generated aerosol is lead to the nozzle 150 via the pipe 120b. Alternatively, aerosol of p-type semiconductor metal oxide and silica is generated by the aerosol generator (not illustrated) including therein p-type semiconductor metal oxide and silica, and aerosol of silica is generated by the aerosol generator (not illustrated) including therein the silica, and the generated aerosols are transported through pipes and ejected from 2 nozzles, respectively, towards a substrate at high speed.

Inside the film formation chamber 140, the substrate 160 is held by the substrate holder 170 to face the jet nozzle 150. As the substrate 160, a cylindrical conductive support, or an electronic device, such as a photoconductor, a solar cell, and an EL element, may be used. An exhaust pump 180 for adjusting the degree of vacuum inside the film formation chamber 140 is connected to the film formation chamber 140 via the pipe 120c.

Although it is not illustrated, the film formation device for forming an electrode of the present embodiment includes a system configured to laterally move the jet nozzle 150 at high speed, while rotating the substrate holder 170 with a rotating unit 170a. A metal oxide layer of a desired area can be formed on the substrate 160 by performing film formation with laterally moving the jet nozzle 150.

In the process for forming the metal oxide layer, first, a compression valve 190 is closed to make the internal atmosphere from the film formation chamber 140 to the aerosol generator 130 vacuum using the exhaust pump 180. Next, the compression valve 190 is open to introduce the gas inside the gas cylinder 110 into the aerosol generator 130 into the aerosol generator 130 via the pipe 120a to scatter the particles 200 inside the vessel. As a result, aerosol in the state where the particles 200 are dispersed in the gas is generated. The generated aerosol is jetted at high speed by the nozzle 150 via the pipe 120b towards the substrate 160. As the time lapses for 0.5 seconds in the state where the compression valve 190 is open, the compression valve 190 is closed for the following 0.5 seconds. Thereafter, the compression valve 190 is again open, and opening and closing of the compression valve 190 are repeated at the cycle of 0.5 seconds. A flow rate of the gas from the gas cylinder 110 is 5 L/min, the film formation duration is 1 hour, the degree of vacuum inside the film formation chamber 140 when the compression valve 190 is closed is about 10 Pa, and the degree of vacuum inside the film formation chamber 140 when the compression valve 190 is open is about 100 Pa.

The jet speed of the aerosol is controlled by the shape of the nozzle 150, the length or inner diameter of the pipe 120b, the internal gas pressure of the gas cylinder 110, or the amount of the gas discharged by the exhaust pump 180 (internal pressure of the film formation chamber 140). When the internal pressure of the aerosol generator 130 is several tens thousands Pa, the internal pressure of the film formation chamber 140 is from several tens through several hundreds Pa, and the shape of opening of the nozzle 150 is a circle having an internal diameter of 1 mm, for example, the jet speed of the aerosol can be set to several hundreds meters per second by the internal pressure difference between the aerosol generator 130 and the film formation chamber 140. When the internal pressure of the film formation chamber 140 is maintained to the range of from 5 Pa through 100 Pa and the internal pressure of the aerosol generator 130 is maintained to 50,000 Pa, a metal oxide layer having porosity of from 5% through 30% can be formed. The average thickness of the metal oxide layer is preferably adjusted to the range of from 0.1 micrometers through 10 micrometers by adjusting the duration of supply of the aerosol under the above-mentioned conditions. The average thickness of the metal oxide layer may be adjusted to an appropriate thickness relative to each electronic device.

In case of an electrophotographic photoconductor that is an example of the electronic device, the preferable average thickness of the metal oxide layer is from 1.2 micrometers through 1.8 micrometers as a condition for obtaining a best mode for durability of the electronic device and high print quality.

The particles 200, which have obtained kinetic energy through acceleration in aerosol, are crushed into the substrate 160, and the particles 200 are finely pulverized by the collision energy. When the pulverized particles are bonded to the substrate 160 and the pulverized particles are bonded to each other, a metal oxide layer is sequentially formed on a charge-transporting layer.

The film formation is performed with a few times of patterning using a line pattern, or rotation of a photoconductor drum. The metal oxide layer of a desired area is formed by scanning the substrate (drum) holder 170 or the jet nozzle 150 in a longitudinal direction and lateral direction of the substrate 160.

<Electrophotographic Photoconductor>

An embodiment of the electronic device of the present disclosure is an electrophotographic photoconductor.

The electrophotographic photoconductor (may be referred to as a "photoconductor" hereinafter) includes a conductive support serving as a support, a charge-transporting layer including a charge-transporting material, where the charge-transporting layer is disposed on or above the conductive support, and the metal oxide layer disposed on or above the charge-transporting layer. The electrophotographic photoconductor further includes a charge-generating layer, and may further include other layers, such as an intermediate layer and a protective layer, according to the necessity.

As the metal oxide layer, the above-described metal oxide layer is appropriately used.

Note that, a layer where the charge-generating layer and the charge-transporting layer are sequentially laminated may be referred to as a photosensitive layer.

An example where the electronic device is an electrophotographic photoconductor will be described below, but an example of the electronic device is not limited to the electrophotographic photoconductor, and the present disclosure can be also applied to other electronic devices.

Figure 6:
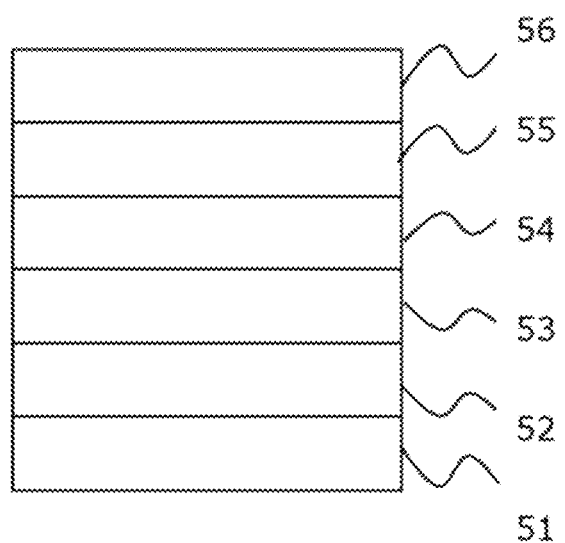
FIG. 6 is a cross-sectional view illustrating one example of an electronic device (electrophotographic photoconductor) of the present disclosure.

A structure of the electronic device 10A that is an electrophotographic photoconductor will be described with reference to FIG. 6. FIG. 6 is a cross-sectional view illustrating one example of the electrophotographic photoconductor.

An embodiment of the electrophotographic photoconductor is illustrated in FIG. 6. In the embodiment of FIG. 6, the electrophotographic photoconductor 10A includes an intermediate layer 52, a charge-generating layer 53, a charge-transporting layer 54, a silicone hardcoat layer 55, and a metal oxide layer 56 disposed on a conductive support 51 in this order. The intermediate layer 52 and the silicone hardcoat layer 55 can be arbitrary omitted.

<<Support (Conductive Support)>>

The conductive support is not particularly limited and may be appropriately selected depending on the intended purpose, as long as the conductive support exhibits conductivity of a volume resistance value of $10^{10}$ ohm·cm or less. Examples thereof include: film or cylindrical plastics or paper coated with metal (e.g., aluminium, nickel, chromium, Nichrome, copper, silver, gold, platinum, and iron) or oxide (e.g., tin oxide, and indium oxide) by vapor deposition or sputtering: and tubes obtained by turning a plate of aluminium, aluminium alloy, nickel, stainless steel, etc., into a tube by a method, such as drawing ironing, impact ironing, extruded ironing, extruded drawing, and machining, followed by a surface treatment, such as machining, superfinishing, and polishing.

<<Intermediate Layer>>

The electrophotographic photoconductor may include an intermediate layer disposed between the conductive support and the photosensitive layer. The intermediate layer is disposed for the purpose of improving adhesion, prevention of moire, improvement of coatability of an upper layer, and prevention of charges injected from the conductive support.

The intermediate layer typically includes a resin as a main component. Since the photosensitive layer is applied on the intermediate layer, a resin used in the intermediate layer is preferably a thermoset resin that is poorly soluble to an organic solvent. Among thermoset resins, polyurethane, a melamine resin, and an alkyd-melamine resin are more preferable as the resin for the intermediate layer because many of the above-listed resins achieve the above-described purposes.

Examples of the organic solvent include tetrahydrofuran, cyclohexanone, dioxane, dichloroethane, and butanone. A coating material of the intermediate layer can be prepared by appropriately diluting the resin with the organic solvent.

Moreover, particles of metal, metal oxide, etc., may be added to the intermediate layer for the purpose of adjusting conductivity or preventing moire. The metal oxide is preferably titanium oxide or zinc oxide. A coating material of the intermediate layer can be prepared by dispersing the particles in the organic solvent by means of a ball mill, an attritor, a sand mill, etc. to prepare a dispersion liquid, and mixing the dispersion liquid and the resin component.

Examples of a production method (film formation method) of the intermediate layer include: a method where a film is formed by applying the coating material on the conductive support by dip coating, spray coating, bead coating, etc.; and a method where an obtained film is optionally heated to cure. The average thickness of the intermediate layer is often appropriately from about 2 micrometers through about 20 micrometers. When residual potentials of the photoconductor are excessively accumulated, the average thickness of the intermediate layer may be less than 3 micrometers.

<<Photosensitive Layer>>

The photosensitive layer of the photoconductor is a laminate photosensitive layer, in which a charge-generating layer and a charge-transporting layer are laminated in this order.

<<Charge-Generating Layer>>

The charge-generating layer is part of the laminate photosensitive layer. The charge-generating layer, which has a function of generating charges as a result of exposure, includes a charge-generating material as a main component, and may further include a binder resin according to the necessity. Examples of the charge-generating material include an inorganic charge-generating material and an organic charge-generating material.

Examples of the inorganic charge-generating material include crystal selenium, amorphous selenium, selenium-tellurium, selenium-tellurium-halogen, a selenium-arsenic compound, and amorphous silicon. As the amorphous silicon, amorphous silicon in which a dangling bond is terminated with a hydrogen atom or a halogen atom, and amorphous silicon doped with a boron atom, a phosphorus atom, etc. are preferably used.

As the organic charge-generating material, known materials can be used. Examples thereof include: metal phthalocyanine, such as titanyl phthalocyanine, and chlorogallium phthalocyanine; metal-free phthalocyanine; an azulenium salt pigment; a squaric acid methine pigment; a symmetric or asymmetric azo pigment having a carbazole skeleton; a symmetric or asymmetric azo pigment having a triphenylamine skeleton; a symmetric or asymmetric azo pigment having a fluorenone skeleton; and a perylene-based pigment. Among the above-listed examples, metal phthalocyanine, a symmetric or asymmetric azo pigment having a fluorenone skeleton, a symmetric or asymmetric azo pigment having a triphenylamine skeleton, and a perylene-based pigment are preferable because quantum efficiency of charge generation is extremely high. The above-listed charge-generating materials may be used alone or in combination.

Examples of the binder resin include polyamide, polyurethane, an epoxy resin, polyketone, polycarbonate, polyacrylate, a silicone resin, an acryl resin, polyvinyl butyral, polyvinyl formal, polyvinyl ketone, polystyrene, poly-N-vinylcarbazole, and polyacrylamide.

Among the above-listed examples, polyvinyl butyral is often used and is effective. The above-listed binder resins may be used alone or in combination.

<<Production Method of Charge-Generating Layer>>

A production method of the charge-generating layer is roughly classified into a vacuum thin film formation method and a casting method of a solution dispersion system.

Examples of the vacuum thin film formation method include vacuum vapor deposition, glow discharge decomposition, ion plating, sputtering, reactive sputtering, and chemical vapor deposition (CVD). The above-listed methods are suitably used for production of a layer formed of the inorganic charge-generating material or the organic charge-generating material.

As the production method of the charge-generating layer by the casting method, the inorganic charge-generating material or the organic charge-generating material is dispersed in an organic solvent optionally together with a binder resin by means of a ball mill, an attritor, a sand mill, etc., to prepare a dispersion liquid, the dispersion liquid is appropriately diluted, and a resultant is coated.

Examples of the organic solvent include tetrahydrofuran, cyclohexanone, dioxane, dichloroethane, and butanone. Among the above-listed examples, methyl ethyl ketone, tetrahydrofuran, and cyclohexanone are preferable because the above-mentioned solvents have low environmental loads compared with chlorobenzene, dichloromethane, toluene, and xylene.

The coating can be performed by dip coating, spray coating, bead coating, etc.

The average thickness of the charge-generating layer is preferably from 0.01 micrometers through 5 micrometers.

When reduction in residual potentials and high sensitivity are important, an increase in a thickness of the charge-generating layer may often improve the above-mentioned properties. On the other hand, the thick charge-generating layer may often deteriorations of chargeability, such as retention of charges or formation of space charge. To balance the above-mentioned advantages with the above-mentioned disadvantages, the average thickness of the charge-generating layer is more preferably from 0.05 micrometers through 2 micrometers.

Moreover, a low molecular compound, such as an antioxidant, a plasticizer, a lubricant, and a UV absorber, and a leveling agent may be optionally added to the charge-generating layer. The above-listed compounds may be used alone or in combination. When the low molecular compound and the leveling agent are used in combination with other components of the charge-generating layer, sensitivity may be often deteriorated. Therefore, an amount of the low molecular compound and the leveling agent is generally preferably from 0.1 phr through 20 phr, and more preferably from 0.1 phr through 10 phr. The amount of the leveling agent for use is preferably from 0.001 phr through 0.1 phr.

<<Charge-Transporting Layer>>

The charge-transporting layer is part of the laminate photosensitive layer, and has a function of injecting and transporting charges generated in the charge-generating layer to neutralize the surface charge of the charged photoconductor. The charge-transporting layer includes a charge-transporting material and a binder component binding the charge-transporting material, as main components.

The charge-transporting material includes an electron-transporting material and a hole-transporting material.

Examples of the electron-transporting material include an electron-accepting material, such as an asymmetric diphenoquinone derivative, a fluorene derivative, and a naphthalimide derivative. The above-listed electron-transporting material may be used alone or in combination.

As the hole-transporting material, an electron-donating material is preferably used. Examples thereof include an oxazole derivative, an oxadiazole derivative, an imidazole derivative, a triphenylamine derivative, a butadiene derivative, 9-(p-diethylaminostyrylanthracene), 1,1-bis-(4-dibenzylaminophenyl)propane, styryl anthracene, styryl pyrazoline, phenyl hydrozone, an α-phenylstilbene derivative, a thiazole derivative, a triazole derivative, a fenadine derivative, an acridine derivative, a benzofuran derivative, a benzimidazole derivative, and a thiophene derivative. The above-listed hole-transporting materials may be used alone or in combination.

Examples of the binder component include a thermoplastic or thermoset resin, such as polystyrene, polyester, polyvinyl, polyacrylate, polycarbonate, an acrylic resin, a silicone resin, a fluororesin, an epoxy resin, a melamine resin, a urethane resin, a phenol resin, and an alkyd resin. Among the above-listed examples, polystyrene, polyester, polyacrylate, and polycarbonate are effectively used as a binder component of the charge-transporting component because many of them exhibit excellent charge-transporting properties.

When an electrically inert polymer compound is used for modification of the charge-transporting layer, a cardo polymer-type polyester having a bulky skeleton, such as fluorene, polyester (e.g., polyethylene terephthalate and polyethylene naphthalate), polycarbonate, in which 3,3' site of a phenol component of bisphenol polycarbonate, such as C-type polycarbonate, is substituted with alkyl, polycarbonate in which a geminal methyl group of bisphenol A is substituted with a long-chain alkyl group having 2 or more carbon atoms, polycarbonate having biphenyl or biphenyl ether skeleton, polycaprolactone, polycarbonate having a long-chain alkyl skeleton, such as polycaprolactone (for example, disclosed in Japanese Unexamined Patent Application Publication No. 07-292095), an acrylic resin, polystyrene, hydrogenated butadiene, etc. are effective.

In the present specification, the term "electrically inert polymer compound" denotes a polymer compound free from a chemical structure exhibiting photoconductivity, such as a triarylamine structure. When such a resin is used as an additive together with a binder resin, an amount thereof is preferably 50% by mass or less relative to a total solid content of the charge-transporting layer considering the restriction associated with optical extinction sensitivity.

When the charge-transporting material is used, an amount of the charge-transporting material is generally preferably from 40 phr through 200 phr, and more preferably from 70 phr through 100 phr. Preferably used is a copolymer, in which the resin component is copolymerized in an amount of from 0 parts by mass through 200 parts by mass, preferably from about 80 parts by mass through about 150 parts by mass relative to 100 parts by mass of the charge-transporting component.

The charge-transporting layer can be formed by dissolving or dispersing a mixture or a copolymer including a charge-transporting component and a binder component as main components in an appropriate solvent to prepare a charge-transporting layer coating material, and applying and drying the coating material. As the coating method, dip coating, spray coating, ring coating, roll coater coating, gravure coating, nozzle coating, screen printing, etc. may be used.

Examples of the dispersing solvent used when the charge-transporting layer coating material is prepared include:

ketones, such as methyl ethyl ketone, acetone, methyl isobutyl ketone, and cyclohexanone; ethers, such as dioxane, tetrahydrofuran, and ethyl cellosolve; aromatics, such as toluene, and xylene; halogens, such as chlorobenzene, and dichloromethane; and esters, such as ethyl acetate and butyl acetate. Among the above-listed examples, methyl ethyl ketone, tetrahydrofuran, and cyclohexanone are preferable because the solvents as mentioned have low environmental loads compared with chlorobenzene, dichloromethane, toluene, and xylene. The above-listed solvents may be used alone or in combination.

In order to secure sensitivity and chargeability required on practice, the average thickness of the charge-transporting layer is preferably from 10 micrometers through 40 micrometers, and more preferably from 15 micrometers through 30 micrometers.

Moreover, a low molecular compound, such as an antioxidant, a plasticizer, a lubricant, and a UV absorber, and a leveling agent, which will be described later, may be optionally added to the charge-transporting layer. When the low molecular compound and the leveling agent are used in combination with other components of the charge-transporting layer, sensitivity may be often deteriorated. Therefore, an amount of the above-listed compounds is generally from 0.1 phr through 20 phr, and preferably from 0.1 phr through 10 phr. An amount of the leveling agent is appropriately from about 0.001 phr through about 0.1 phr.

<<Silicone Hardcoat Layer>>

The silicone hardcoat layer is formed by crosslinking an organic silicon compound having a hydroxyl group or a hydrolyzable group. The silicone hardcoat layer may further include a catalyst, a crosslinking agent, organosilica sol, a silane coupling agent, or a polymer, such as an acryl polymer, according to the necessity.

The crosslinking is not particularly limited and may be appropriately selected depending on the intended purpose. The crosslinking is preferably thermal crosslinking.

Examples of the organic silicon compound having a hydroxyl group or a hydrolyzable group include a compound having an alkoxysilyl group, a partial hydrolysis condensate of the compound having an alkoxysilyl group, and a mixture thereof.

Examples of the compound having an alkoxysilyl group include: tetraalkoxysilane, such as tetraethoxysilane; alkyltrialkoxysilane, such as methyltriethoxysilane; and aryltrialkoxysilane, such as phenyltriethoxysilane.

Note that, an epoxy group, a methacryloyl group, or a vinyl group may be introduced into any of the above-listed compounds.

The partial hydrolysis condensate of the compound having an alkoxysilyl group can be produced by any of methods known in the art, such as by adding predetermined amounts of water, a catalyst, etc. to the compound having an alkoxysilyl group to allow the mixture to react.

As a raw material of the silicone hardcoat layer, a commercial product can be used. Specific examples thereof include GR-COAT (available from Daicel Corporation), Glass Resin (available from OWENS CORNING JAPAN LLC.), heat-less glass (available from OHASHI CHEMICAL INDUSTRIES LTD.), NSC (available from NIPPON FINE CHEMICAL CO., LTD.), glass raw fluid GO150SX and GO200CL (available from Fine Glass Technologies Co., Ltd.), and as copolymers between an alkoxysilyl compound and an acrylic resin or a polyester resin, MKC silicate (available from Mitsubishi Chemical Corporation), and silicate/acryl varnish XP-1030-1 (available from Dainippon Shikizai Kogyo Co., Ltd.).

A thickness of the silicone hardcoat layer is preferably 0.1 micrometers or greater but 4.0 micrometers or less, and more preferably 0.3 micrometers or greater but 1.5 micrometers or less.

<<Metal Oxide Layer>>

The metal oxide layer of the electrophotographic photoconductor and a production method thereof are appropriately selected from the detailed descriptions of the metal oxide layer of the electronic device of the present disclosure and the production method thereof.

<Production Method of Electronic Device>

The method for producing an electronic device of the present disclosure is a production method of an electronic device including a support, a charge-transporting layer including a charge-transporting material or a sensitizing-dye electrode layer including a sensitizing dye, where the charge-transporting layer or the sensitizing-dye electrode layer disposed on or above the support, and a metal oxide layer disposed on or above the charge-transporting layer or the sensitizing-dye electrode layer. The method includes spraying p-type semiconductor metal oxide, and silica or metal oxide particles to form the metal oxide layer.

The method for spraying the p-type semiconductor metal oxide and the silica or metal oxide particles is not particularly limited and may be appropriately selected depending on the intended purpose. The method is preferably aerosol deposition.

<Image Forming Apparatus and Image Forming Method>

The image forming apparatus of the present disclosure includes the electronic device (electrophotographic photoconductor). The image forming apparatus further includes an electrostatic latent image forming unit and a developing unit, and may further include other units according to the necessity.

The image forming method associated with the present disclosure includes at least an electrostatic latent image forming step, and a developing step, and may further include other steps according to the necessity.

The image forming method is suitably performed by the image forming apparatus, the electrostatic latent image forming step is suitably performed by the electrostatic latent image forming unit, the developing step is suitably performed by the developing unit, and the above-mentioned other steps are suitably performed by the above-mentioned other units.

Embodiments of Image Forming Apparatus

Structural examples of the image forming apparatus will be described with reference to drawings hereinafter.

An example of the image forming apparatus is illustrated in FIG. 1. The charging device 12 is a unit configured to uniformly charge a surface of the electrophotographic photoconductor 11. As the charging device 12, any of known units, such as a corotron, a scorotron, a solid state charger, and a charging roller may be used. The charging device 12 is preferably used to be arranged in contact with or adjacent to the electrophotographic photoconductor 11 in view of reduction in power consumption. In order to prevent contamination of the charging device 12, preferred is a charging system that is disposed adjacent to the electrophotographic photoconductor 11 having an appropriate gap between the electrophotographic photoconductor 11 and a surface of the charging device 12. Typically, the above-described charger can be used as a transferring device 16. As the transferring device 16, a combination of a transfer charger and a separation charger is effective.

The electrophotographic photoconductor 11 is driven by a driving unit 1C. Charging by the charging device 12, image exposure by the exposing device 13, developing, transferring by the transferring device 16, pre-cleaning exposure by the pre-cleaning exposing device 1B, cleaning by the cleaning device 17, charge elimination by the charge eliminating device 1A are repetitively performed. A lubricant 3A, a coating brush 3B for coating the lubricant, and a coating blade 3C are disposed between the cleaning device 17 and the charging device 12 along the traveling direction of the electrophotographic photoconductor 11, as illustrated in FIG. 1.

In FIG. 1, light for pre-cleaning exposure is applied from the side of the support of the electrophotographic photoconductor 11 (in this case, the support is transparent to light).

The above-described photoelectric process is an example. For example, the pre-cleaning exposure is performed from the side of the support in FIG. 1, but the pre-cleaning exposure may be performed from the side of the photosensitive layer. Moreover, application of image exposure light and charge-elimination light may be performed from the side of the support. Meanwhile, image exposure light, pre-cleaning exposure light, and charge-eliminating light are illustrated as the light irradiation steps. However, other than the light irradiation steps, transfer pre-exposure, pre-exposure of image exposure, and other light irradiation steps known in the art may be performed to perform light irradiation on the electrophotographic photoconductor.

Figure 2:
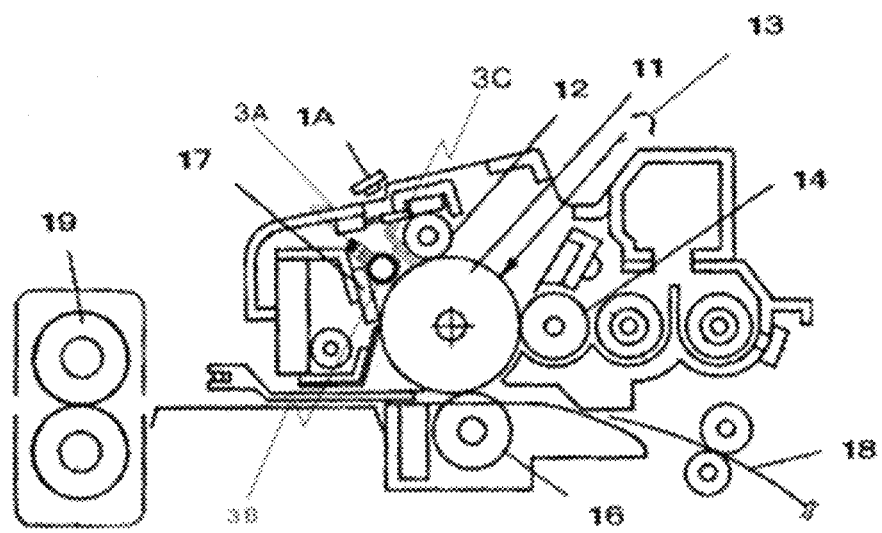
FIG. 2 is a schematic structural view illustrating another example of the image forming apparatus of the present disclosure.

Moreover, the above-described image forming unit may be fixed and integrated with a photocopier, a facsimile, or a printer. Alternatively, the image forming unit may be integrated with any of the above-mentioned devices in the form of a process cartridge. Many examples of a shape of the process cartridge may be listed, but as a typical example, the shape illustrated in FIG. 2 is listed. The electrophotographic photoconductor 11 has a drum shape, but the electrophotographic photoconductor 11 may be in the shape of a sheet, or an endless belt.

The process cartridge includes at least an electrophotographic photoconductor bearing an electrostatic latent image thereon, a developing unit configured to develop the electrostatic latent image born on the electrophotographic photoconductor with a toner to form a visible image, and a lubricant supplying unit configured to supply a lubricant onto the electrophotographic photoconductor. The process cartridge may further include appropriately selected other units, such as a charging unit, an exposing unit, a transferring unit, a cleaning unit, and a charge-eliminating unit according to the necessity. The developing unit includes at least a developer container configured to store thereon a toner or a developer, and a developer bearer configured to bear and transport the toner or developer stored in the developer container. The developing unit may further include a layer thickness regulating member configured to regulate a thickness of a toner layer born on the developer bearer. The process cartridge can be detachably mounted in various electrophotographic image forming apparatuses, facsimiles, and printers, and is particularly preferably detachably mounted in the image forming apparatus of the present disclosure.

Figure 3:
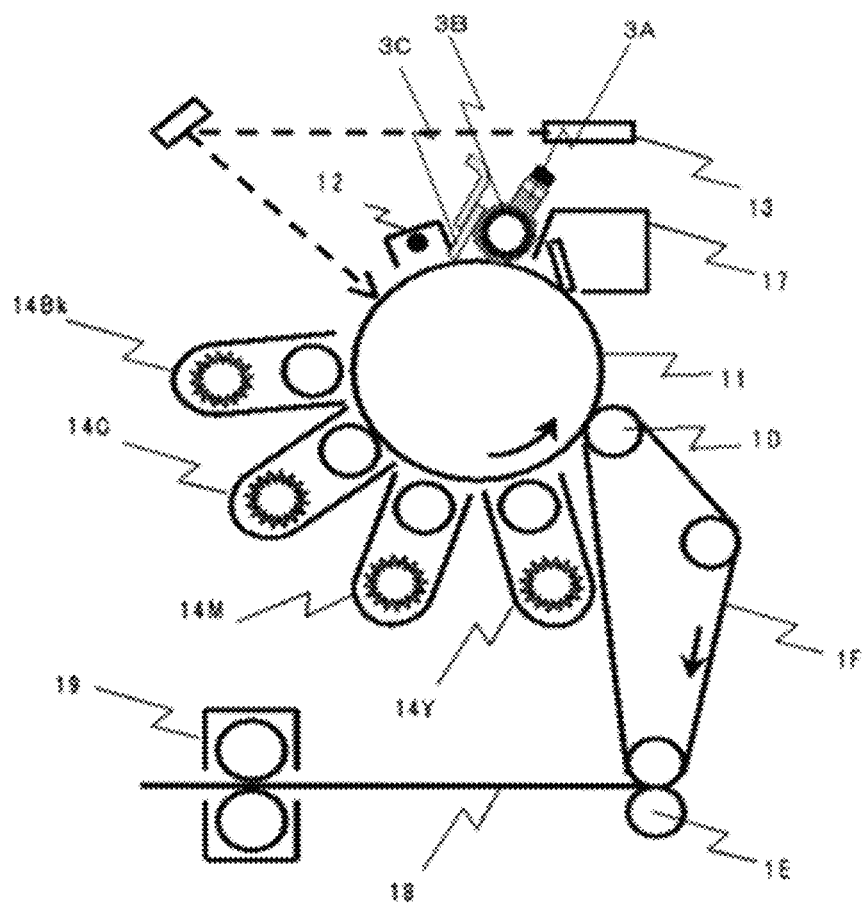
FIG. 3 is a schematic structural view illustrating one example of an image forming unit in the image forming apparatus of the present disclosure.

FIG. 3 illustrates another example of the image forming apparatus. In the image forming apparatus, a charging device 12, an exposing device 13, black (Bk), cyan (C), magenta (M), and yellow (Y) developing devices 14Bk, 14C, 14M, and 14Y, an intermediate transfer belt 1F that is an intermediate transfer member, and a cleaning device 17 are disposed in the periphery of the electrophotographic photoconductor 11 in this order.

Note that, the letters (Bk, C, M, and Y) depicted in FIG. 3 denote colors of the toner, and are appropriately omitted, if necessary. Each color of the developing devices 14Bk, 14C, 14M, and 14Y can be independently controlled, and only the developing device of the color used for image formation is driven. A toner image formed on the electrophotographic photoconductor 11 is transferred onto the intermediate transfer belt 1F by a first transferring device 1D disposed at the inner side of the intermediate transfer belt 1F.

The first transferring device 1D is disposed in the manner that the first transferring device 1D can be in contact with the electrophotographic photoconductor 11, and the intermediate transfer belt 1F is brought into contact with the electrophotographic photoconductor 11 only during a transfer operation. Image formation of each color is performed, and toner images superimposed on the intermediate transfer belt 1F are collectively transferred onto a print medium 18 by a second transferring device 1E, followed by fixing by a fixing device 19 to form an image. The second transferring device 1E is also disposed in the manner that the second transferring device 1E can be in contact with the intermediate transfer belt 1F, and is brought into contact with the intermediate transfer belt 1F only during a transfer operation.

In the image forming apparatus of the transfer drum-system, toner images of different colors electrostatically attracted to the transfer drum are sequentially transferred to a print medium, and therefore there is a restriction that the image forming apparatus of the transfer drum-system cannot perform printing on thick paper. Meanwhile, in the image forming apparatus of the intermediate transfer system, as illustrated in FIG. 3, toner images of different colors are superimposed on the intermediate transfer member 1F. Therefore, there is no restriction in print media for use. The above-described intermediate transfer system can be applied to, not only the device illustrated in FIG. 3, but also image forming apparatuses as illustrated in FIGS. 1, 2, 4, and 5.

The lubricant 3A, and the coating brush 3B and coating blade 3C for coating the lubricant are disposed between the cleaning device 17 and the charging device 12 relative to the rotational direction of the electrophotographic photoconductor 11, as illustrated in FIG. 3.

Figure 4:
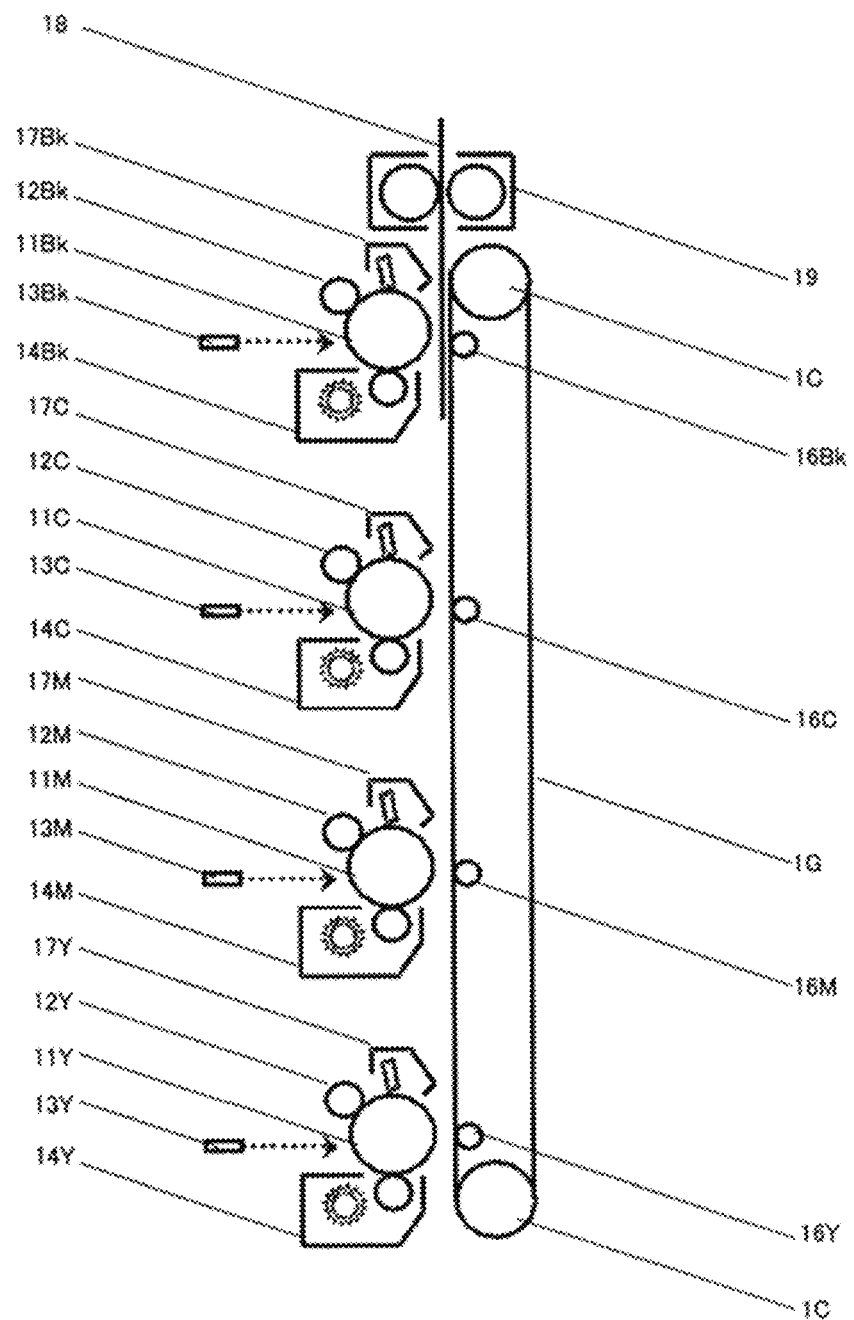
FIG. 4 is a schematic structural view illustrating another example of the image forming apparatus of the present disclosure.

FIG. 4 illustrates another example of the image forming apparatus. The image forming apparatus uses 4 colors of toners, i.e., yellow (Y), magenta (M), cyan (C), and black (Bk), and an image forming unit for each color is disposed in the image forming apparatus. Moreover, electrophotographic photoconductors for the 4 colors 11Y, 11M, 11C, and 11Bk are disposed. At the periphery of each electrophotographic photoconductor 11Y, 11M, 11C, or 11Bk, a charging device 12Y, 12M, 12C, or 12Bk, an exposing device 13Y, 13M, 13C, or 13Bk, a developing device 14Y, 14M, 14C, or 14Bk, a cleaning device 17Y, 17M, 17C, or 17Bk, etc. are disposed.

Moreover, a conveying transfer belt 1G, which is a transfer material bearer that is brought in and out each of transfer positions of the electrophotographic photoconductors 11Y, 11M, 11C, and 11Bk disposed along a straight line, is held with a driving unit 1C. Transferring devices 16Y, 16M, 16C, and 16Bk are disposed at the transfer positions facing the electrophotographic photoconductors 11Y, 11M, 11C, and 11Bk, respectively, via the conveying transfer belt 1G.

The tandem system image forming apparatus illustrated in FIG. 4 includes an electrophotographic photoconductor for each color 11Y, 11M, 11C, or 11Bk, and toner images of all colors are sequentially transferred onto a print medium held on a conveying transfer belt 1G. Therefore, the tandem system image forming apparatus can output a full color image at significantly high speed compared with a full-color image forming apparatus including only one electrophotographic photoconductor. A toner image developed on the print medium 18 serving as a transfer material is transported to a fixing device 19 from the position at which the electrophotographic photoconductor 11Bk and the transferring device 16Bk face each other, and the toner image is fixed on the print medium 18 by the fixing device 19.

Figure 5:
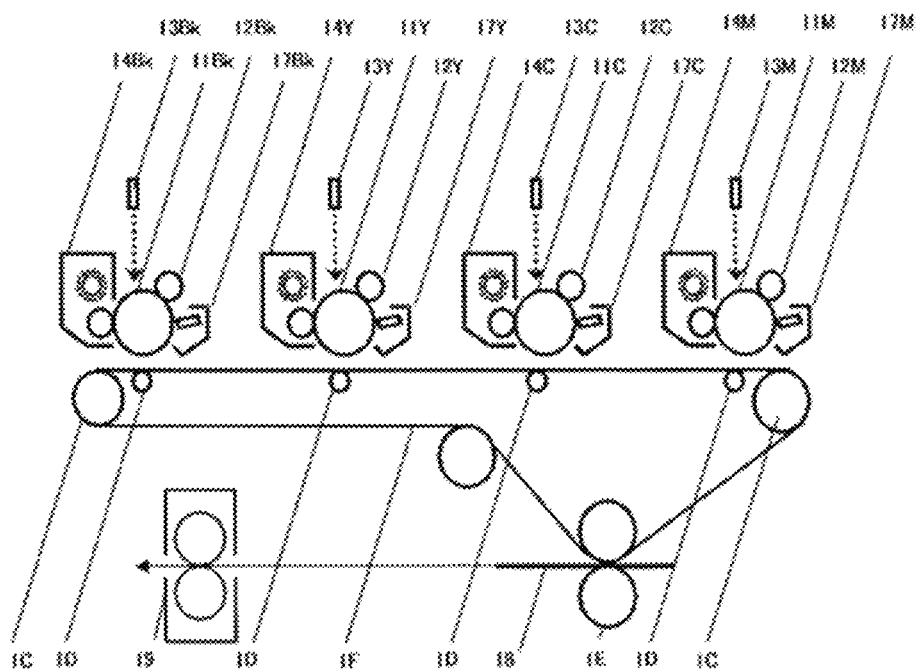
FIG. 5 is a schematic structural view illustrating another example of the image forming apparatus of the present disclosure.

Moreover, the image forming apparatus may have a structure in an embodiment illustrated in FIG. 5. Specifically, the structure using the intermediate transfer belt 1F as illustrated in FIG. 5 can be used, instead of a direct transfer system using the conveying transfer belt 1G illustrated in FIG. 4.

In the example illustrated in FIG. 5, the image forming apparatus includes an electrophotographic photoconductor for each color 11Y, 11M, 11C, or 11Bk, toner images of all colors formed by the electrophotographic photoconductors are sequentially transferred and laminated onto the intermediate transfer belt 1F that is driven and supported by the driving unit that includes rollers 1C by a primary transferring unit 1D that is a first transferring unit, to thereby form a full-color image.

Next, the intermediate transfer belt 1F is further driven, and the full-color image born thereon is transported to a position at which a secondary transferring unit 1E that is the second transferring device and the roller disposed to face the secondary transferring unit 1E. Then, the full-color image is secondary transferred onto a transfer material 18 by the secondary transferring unit 1E, to thereby form a desired image on the transfer material.

<Solar Cell>

One embodiment of the electronic device of the present disclosure is a solar cell.

The solar cell includes a support, a sensitizing-dye electrode layer including a sensitizing dye, and the metal oxide layer disposed on or above the sensitizing-dye electrode layer. The solar cell further includes a first electrode, a hole-blocking layer, and a second electrode, and may further include other members according to the necessity.

The example where the electronic device is a solar cell will be described hereinafter, but the electronic device is not limited to a solar cell and may be applied for other electronic devices.

The solar cell (electronic device) of the present disclosure will be described with reference to drawings hereinafter. Note that, the present disclosure is not limited to the embodiments described below. The embodiments described below may be changed, such as another embodiments may be used or additions, corrections, or omissions may be performed in the below-described embodiments within the range with that a person skilled in the art can be arrived, and any of the above-mentioned embodiments are included in the scope of the present disclosure as long as the functions and effects of the present disclosure are exhibited.

The solar cell (electronic device) includes a substrate serving as a support, a first electrode, a hole-blocking layer, an electron-transporting layer, a sensitizing-dye electrode layer, a ceramic semiconductor film serving as a metal oxide layer, and a second electrode.

Figure 7:
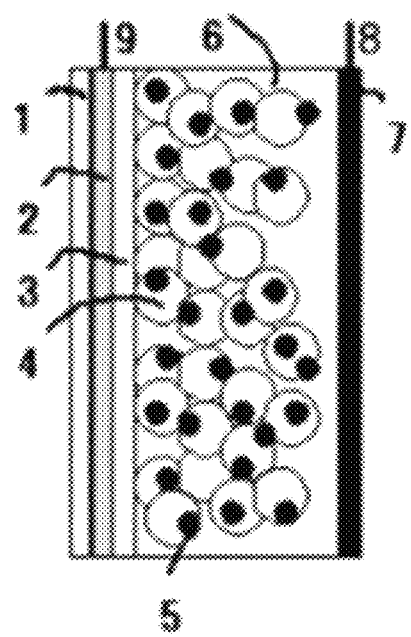
FIG. 7 is a cross-sectional view illustrating one example of the electronic device (solar cell) of the present disclosure.

The structure of the electronic device 10B, which is a solar cell, will be described with reference to FIG. 7. FIG. 7 is a cross-sectional view illustrating one example of the solar cell.

In the embodiment illustrated in FIG. 7, a first electrode 2 is formed on a substrate 1 serving as a support, a hole-blocking layer 3 is formed on the first electrode 2, an electron-transporting layer is formed on the hole-blocking layer 3, a photosensitizing material 5 is adsorbed on an electron-transporting material of an electron-transporting layer 4, and a metal oxide 6 is disposed between the first electrode 2 and a second electrode 7 facing the first electrode 2. In FIG. 7, moreover, illustrated is an example of a structure where lead lines 8 and 9 are disposed to electrically connect the first electrode 2 and the second electrode 7.

The metal oxide and the electron-transporting layer 4 may penetrate into each other to partially bleed into each other.

The details are described hereinafter.

<<Support (Substrate)>>

A substrate 1 serving as the support is not particularly limited and can be selected from substrates known in the art. The substrate 1 is preferably a transparent material. Examples thereof include glass, a transparent plastic plate, a transparent plastic film, and an inorganic transparent crystal.

<First Electrode>

The first electrode 2 is not particularly limited as long as the first electrode 2 is a conductive material transparent to visible light. As the first electrode 2, electrodes known in the art, such as a general photoelectric conversion element, and a liquid crystal panel, can be used.

Examples of a material of the first electrode include indium-tin oxide (referred to as ITO hereinafter), fluorine-doped tin oxide (referred to as FTO hereinafter), antimony-doped tin oxide (referred to as ATO hereinafter), indium-zinc oxide, niobium-titanium oxide, and graphene. The above-listed materials may be used alone or in combination as a laminate.

The average thickness of the first electrode is preferably from 5 nm through 10 micrometers, and more preferably from 50 nm through 1 micrometer.

In order to maintain certain hardness, moreover, the first electrode is preferably disposed on the substrate 1 formed of a material transparent to visible light. As the substrate, for example, glass, a transparent plastic plate, a transparent plastic film, an inorganic transparent crystal, etc. is used.

The first electrode integrated with the substrate known in the art may be used. Examples thereof include FTO-coated glass, ITO-coated glass, zinc oxide:aluminium-coated glass, an FTO-coated transparent plastic film, an ITO-coated transparent plastic film.

Moreover, the first electrode may be a transparent electrode prepared by doping tin oxide or indium oxide with a cation or anion having a different valency, and a metal electrode having a structure that can pass through light, such as mesh or stripes, disposed on a substrate, such as a glass substrate.

The above-listed examples may be used alone, or a mixture, or a laminate.

Moreover, a metal lead wire etc. may be used in combination for the purpose of reducing resistance.

Examples of a material of the metal lead wire include metals, such as aluminium, copper, silver, gold, platinum, and nickel. The metal lead wire is disposed on the substrate by vapor deposition, sputtering, pressure bonding, etc., and ITO or FTO is disposed thereon.

<<Hole-Blocking Layer>>

A material constituting the hole-blocking layer 3 is not particularly limited as long as the material is transparent to visible light and is an electron-transporting material. The material thereof is particularly preferably titanium oxide.

The hole-blocking layer is disposed to suppress a reduction in electricity caused by recombination (i.e., reverse electron transport) between a hole in an electrolyte and an electron present at a surface of an electrode when the electrode is brought into contact with the electrolyte hole-blocking layer. The above-described effect of the hole-blocking layer 3 is especially significantly exhibited with a solid dye-sensitized solar cell. This is because a solid dye-sensitized solar cell using an organic hole-transporting material etc. has high recombination (reverse electron transport) speed between a hole in the hole-transporting material and an electron present at the surface of the electrode, compared with a wet dye-sensitized solar cell using an electrolyte solution.

A method for forming the hole-blocking layer is not particularly limited, but having high internal resistance is important to prevent current loss due to room light. Therefore, the method for forming the hole-blocking layer is also important. Examples thereof typically include a sol gel method that is a wet film formation. The sol gel method may not be able to sufficiently present loss current. Therefore, the method thereof is more preferably dry film formation, such as sputtering, and the dry film formation can give sufficiently high film density and can prevent current loss.

The hole-blocking layer is formed for the purpose of preventing electronic contact between the first electrode 2 and the hole-transporting layer 6. The average thickness of the hole-blocking layer is not particularly limited. The average thickness of the hole-blocking layer is preferably from 5 nm through 1 micrometer. In wet film formation, the average thickness thereof is more preferably from 500 nm through 700 nm. In dry film formation, the average thickness thereof is more preferably from 10 nm through 30 nm.

<<Electron-Transporting Layer>>

The solar cell includes a porous electron-transporting layer 4 disposed on the hole-blocking layer 3. The electron-transporting layer may be a single layer or a multiple layer.

The electron-transporting layer is formed of an electron-transporting material. As the electron-transporting material, semiconductor particles are preferably used.

In case of the multiple layer, dispersion liquids each including semiconductor particles of different particle size may be applied to form multiple layers, or coating layers each including different types of semiconductor particles, or each having different compositions of resins or additives may be provided to form multiple layers. The multiple layer coating is effective when a sufficient average thickness cannot be provided with one coating.

As the average thickness of the electron-transporting layer increases, generally, an amount of the born photosensitizing material per unit projection area increases, and therefore a capturing rate of light increases. However, a diffusion length of injected electrons increases, and therefore a loss of charges due to recombination also increases. Accordingly, the average thickness of the electron-transporting layer is preferably from 100 nm through 100 micrometers.

The semiconductor is not particularly limited, and any of semiconductors known in the art can be used as the semiconductor. Specific examples thereof include: single semiconductors, such as silicon and germanium; compound semiconductors, such as metal chalcogenide; and a compound having the Perovskite structure.

Examples of the metal chalcogenide include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and telluride of cadmium.

Examples of other compound semiconductors include: phosphides of zinc, gallium, indium, and cadmium; gallium arsenide; copper-indium-selenide; and copper-indium-sulfide.

Moreover, the compound having the Perovskite structure is preferably strontium titanate, calcium titanate, sodium titanate, barium titanate, or potassium niobate is preferable.

Among the above-listed examples, oxide semiconductors are preferable, and titanium oxide, zinc oxide, tin oxide, and niobium oxide are particularly preferable. The above-listed examples may be used alone or in combination as a mixture.

A crystal type of the above-listed semiconductors is not particularly limited. The crystal type thereof may be a single crystal, polycrystalline, or amorphous.

The average particle diameter of primary particles of the semiconductor particles is not particularly limited. The average particle diameter thereof is preferably from 1 nm through 100 nm, and more preferably from 5 nm through 50 nm.

Moreover, the efficiency can be improved by mixing or laminating semiconductor particles having the larger average particle diameter owing to an effect of scattering incident light. In this case, the average particle diameter of the semiconductor is preferably from 50 nm through 500 nm.

A production method of the electron-transporting layer is not particularly limited. The production method thereof include a method for forming a thin film in vacuum, such as sputtering, and a wet film forming method.

In view of production cost, a wet film formation method is particularly preferable. Preferred is a method where a paste, in which a powder or sol of semiconductor particles is dispersed, is prepared, and the paste is applied onto an electron collector electrode substrate.

When the wet film forming method is used, the coating method is not particularly limited and coating can be performed according to any of methods known in the art. Coating can be performed according to various methods, such as dip coating, spraying, wire bar coating, spin coating, roller coating, blade coating, gravure coating, and a wet printing method (e.g., relief printing, offset printing, gravure printing, intaglio printing, rubber plate printing, and screen printing).

When the dispersion liquid of the semiconductor particles is formed by mechanical pulverization or using a mill, the dispersion liquid is formed by dispersing at least semiconductor particles alone, or a mixture including the semiconductor particles and a resin in water or an organic solvent. Examples of the resin for use include: a polymer or copolymer of a vinyl compound, such as styrene, vinyl acetate, acrylic acid ester, and methacrylic acid ester; a silicone resin; a phenoxy resin; a polysulfone resin; a polyvinyl butyral resin; a polyvinyl formal resin; a polyester resin; a cellulose ester resin; a cellulose ether resin; a urethane resin; a phenol resin; an epoxy resin; a polycarbonate resin; a polyacrylate resin; a polyamide resin; and a polyimide resin.

Examples of the solvent for dispersing the semiconductor particles include: water; alcohol-based solvents, such as methanol, ethanol, isopropyl alcohol, and α-terpineol; ketone-based solvents, such as acetone, methyl ethyl ketone, and methyl isobutyl ketone; ester-based solvents, such as ethyl formate, ethyl acetate, and n-butyl acetate; ether-based solvents, such as diethyl ether, dimethoxy ethane, tetrahydrofuran, dioxolane, and dioxane; amide-based solvents, such as N,N-dimethylformamide, N,N-dimethylacetamide, and N-methyl-2-pyrrolidone; halogenated hydrocarbon-based solvents, such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvents, such as n-pentane, n-hexane, n-octane, 1,5-hexadiene, cyclohexane, methylcyclohexane, cyclohexadiene, benzene, toluene, o-xylene, m-xylene, p-xylene, ethyl benzene, and cumene. The above-listed examples may be used alone or in combination.

The dispersion liquid of the semiconductor particles, or the paste of the semiconductor particles obtained by a sol-gel method etc. may include acid (e.g., hydrochloric acid, nitric acid, and acetic acid), a surfactant (e.g., polyoxyethylene (10) octylphenyl ether), and a chelating agent (e.g., acetylacetone, 2-aminoethanol, and ethylenediamine) in order to prevent re-aggregation of the particles.

Moreover, it is also effective to add a thickening agent for the purpose of improving film formability. Examples of the thickening agent include: a polymer, such as polyethylene glycol, and polyvinyl alcohol; and ethyl cellulose.

After the semiconductor particles are applied, the particles are made electrically contact with one another, and firing, microwave irradiation, electron beam irradiation, or laser light irradiation is preferably performed for improving a film strength or adhesion to the substrate. The above-listed examples may be performed alone or in combination.

When the firing is performed, a range of a firing temperature is not particularly limited. When the temperature is too high, resistance of the substrate may be excessively high or the substrate may be melted. Therefore, the fixing temperature is preferably from 30 degrees Celsius through 700 degrees Celsius, and more preferably from 100 degrees Celsius through 600 degrees Celsius. Moreover, the firing duration is not particularly limited, but the firing duration is preferably from 10 minutes through 10 hours.

For the microwave irradiation, microwaves may be applied from the side of the electron-transporting layer, or the back side. The irradiation duration is not particularly limited, but the microwave irradiation is preferably performed within 1 hour.

After the firing, chemical plating using a mixed solution of a titanium tetrachloride aqueous solution and an organic solvent, or electrochemical plating using a titanium tetrachloride aqueous solution may be performed increasing a surface area of the semiconductor particles, or increasing electron injection efficiency from the photosensitizing material to the semiconductor particles.

The film formed by laminating the semiconductor particles having diameters of several tens nanometers by firing forms a porous state. The nano-porous structure has an extremely high surface area, and the surface area can be represented by a roughness factor.

The roughness factor is a numerical value representing an actual area of an inner area of the pores relative to an area of the semiconductor particles applied to the substrate. Therefore, the larger roughness factor is more preferable. The roughness factor is correlated with the average thickness of the electron-transporting layer. In the present disclosure, the roughness factor is preferably 20 or greater.

<<Sensitizing-Dye Electrode Layer>>

The solar cell includes a sensitizing-dye electrode layer for further improving conversion efficiency. The sensitizing-dye electrode layer is a layer where a sensitizing dye (photosensitizing material) is adsorbed on a surface of the electron-transporting material that is the electron-transporting layer 4.

—Sensitizing Dye (Photosensitizing Material)—

The photosensitizing material 5 serving as the sensitizing dye is not limited as long as the photosensitizing material 5 is a compound that is photoexcited by excitation light for use.

Specific examples thereof include: metal complex compounds disclosed in Japanese Translation of PCT International Application Publication No. JP-T-07-500630, Japanese Unexamined Patent Application Publication Nos. 10-233238, 2000-26487, 2000-323191, and 2001-59062; coumarin compounds disclosed in Japanese Unexamined Patent Application Publication Nos. 10-93118, 2002-164089, and 2004-95450, and J. Phys. Chem. C, 7224, Vol. 111 (2007); polyene compounds disclosed in Japanese Unexamined Patent Application Publication No. 2004-95450, and Chem. Commun., 4887 (2007); indoline compounds disclosed in Japanese Unexamined Patent Application Publication Nos. 2003-264010, 2004-63274, 2004-115636, 2004-200068, and 2004-235052, J. Am. Chem. Soc., 12218, Vol. 126 (2004), Chem. Commun., 3036 (2003), and Angew. Chem. Int. Ed., 1923, Vol. 47 (2008); thiophene compounds disclosed in J. Am. Chem. Soc., 16701, Vol. 128 (2006), and J. Am. Chem. Soc., 14256, Vol. 128 (2006); cyanine dyes disclosed in Japanese Unexamined Patent Application Publication Nos. 11-86916, 11-214730, 2000-106224, 2001-76773, and 2003-7359; merocyanine dyes disclosed in Japanese Unexamined Patent Application Publication Nos. 11-214731, 11-238905, 2001-52766, 2001-76775, and 2003-7360; 9-arylxanthene compounds disclosed in Japanese Unexamined Patent Publication Nos. 10-92477, 11-273754, 11-273755, and 2003-31273; triarylmethane compounds disclosed in Japanese Unexamined Patent Application Publication Nos. 10-93118 and 2003-31273; and phthalocyanine compounds and coumarin compounds disclosed in Japanese Unexamined Patent Application Publication Nos. 09-199744, 10-233238, 11-204821, 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalo-cyanines, 230, Vol. 3 (1999), Angew. Chem. Int. Ed., 373, Vol. 46 (2007), and Langmuir, 5436, Vol. 24 (2008). Among the above-listed examples, the metal complex compound, the coumarin compound, the polyene compound, the indoline compound, and the thiophene compound are particularly preferably used.

As the method for making the photosensitizing material 5 adsorbed on the electron-transporting layer 4, a method where an electron collector electrode including semiconductor particles is immersed in a photosensitizing material solution or a dispersion liquid, or a method where a solution or dispersion liquid is applied to the electron-transporting layer to make the semiconductor particles adsorbed thereon may be used.

In the case of the former method, immersing, dip coating, roller coating, air knife coating, etc. may be used.

In the case of the latter method, wire bar coating, slide hopper coating, extrusion, curtain coating, spin coating, spray coating, etc. may be used.

Moreover, adsorption of the semiconductor particles may be performed in a super-critical fluid using carbon dioxide etc.

When the photosensitizing material is adsorbed, a condensing agent may be used in combination.

The condensing agent may be an agent having a catalytic function to bind a photosensitizing material and an electron-transporting compound onto a surface of an inorganic material physically or chemically, or an agent that stoichiometrically functions to advantageously shift chemical equilibrium. Moreover, thiol or a hydroxyl compound may be added as a condensation aid.

Examples of the solvent for dissolving or dispersing the photosensitizing material include: water; alcohol-based solvents, such as methanol, ethanol, and isopropyl alcohol; ketone-based solvents, such as acetone, methyl ethyl ketone, and methyl isobutyl ketone; ester-based solvents, such as ethyl formate, ethyl acetate, and n-butyl acetate; ether-based solvents, such as diethyl ether, dimethoxy ethane, tetrahydrofuran, dioxolane, and dioxane; amide-based solvents, such as N,N-dimethylformamide, N,N-dimethylacetamide, and N-methyl-2-pyrrolidone; halogenated hydrocarbon-based solvents, such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvents, such as n-pentane, n-hexane, n-octane, 1,5-hexadiene, cyclohexane, methylcyclohexane, cyclohexadiene, benzene, toluene, o-xylene, m-xylene, p-xylene, ethyl benzene, and cumene. The above-listed examples may be used alone or in combination.

Moreover, there is a photosensitizing material that more effectively functions when aggregation between molecules of a compound is suppressed depending on a type of the photosensitizing material. Therefore, a disaggregation agent may be used in combination.

The disaggregation agent is preferably a steroid compound (e.g., cholic acid, and chenodeoxycholic acid), long-chain alkyl carboxylic acid, or a long-chain alkyl phosphonic acid. The disaggregation agent is appropriately selected depending on the photosensitizing material for use.

An amount of the disaggregation agent is preferably from 0.01 parts by mass through 500 parts by mass, and more preferably from 0.1 parts by mass through 100 parts by mass relative to 1 part by mass of the photosensitizing material.

A temperature at which the photosensitizing material, or a combination of the photosensitizing material and the disaggregation agent is adsorbed is preferably −50 degrees Celsius or higher but 200 degrees Celsius or lower. Moreover, the adsorption may be performed with standing or stirring.

Examples of a method for the stirring include stirring using a stirrer, a ball mill, a paint conditioner, a sand mill, an attritor, and a disperser, and ultrasonic dispersion, but the method is not limited to the above-listed examples. The time required for the adsorption is preferably 5 seconds or longer but 1,000 hours or shorter, more preferably 10 seconds or longer but 500 hours or shorter, and more preferably 1 minute or longer but 150 hours or shorter. Moreover, adsorption is preferably performed in the dark.

<<Metal Oxide Layer>>

The metal oxide layer 6 in the solar cell and a production method thereof are appropriately selected from the descriptions of the metal oxide layer of the electronic device of the present disclosure, and the production method thereof.

<<Second Electrode>>

The second electrode is disposed after forming the metal oxide layer.

Moreover, an electrode identical to the first electrode can be typically used as the second electrode. A support is not necessarily disposed in a structure where a strength and gas tightness are sufficiently maintained.

Specific examples of a material of the second electrode include: metal, such as platinum, gold, silver, copper, and aluminium; carbon-based compounds, such as graphite, fullerene, carbon nanotubes, and grapheme; conductive metal oxide, such as ITO, FTO, and ATO; and conductive polymers, such as polythiophene, and polyaniline.

The average thickness of the second electrode is not particularly limited. Moreover, the above-listed materials may be used alone or in combination.

The second electrode can be appropriately formed on the hole-transporting layer by a method, such as coating, laminating, vapor deposition, CVD, and bonding, depending on materials for use, or a type of the hole-transporting layer.

In order for the electronic device to function as a photoelectric conversion device (photoelectric conversion element), the first electrode or the second electrode, or the both are substantially transparent.

In the electronic device of the present disclosure, the side where the first electrode is disposed is transparent, and sunlight is preferably applied from the side of the first electrode. In this case, a material that reflects light is preferably used at the side of the second electrode, and the material is preferably glass or a plastic coated with metal or conductive oxide by vapor deposition, or a metal film.

Moreover, it is also effective to dispose an anti-reflection layer at the side from which sunlight is applied.

The photoelectric conversion element of the present disclosure can be applied for a solar cell and a power supply including the solar cell. Application examples may be any of devices that have used a solar cell, or a power supply using the solar cell. For example, the photoelectric conversion element may be used for a solar cell of a desk-top electronic calculator or a watch. Examples utilizing properties of the photoelectric conversion element of the present disclosure include a power supply of a cell phone, electronic organizer, electronic paper, etc. Moreover, the photoelectric conversion element can be used as an auxiliary power supply for extending a continuous usage time of a charge-type or dry cell-type electrical appliance. Moreover, the photoelectric conversion element can be used as a primary cell alternative combined with a secondary cell, serving as a self-sufficient power supply for a sensor.

<Organic Electroluminescent Element>

An embodiment of the electronic device of the present disclosure is an organic electroluminescent (EL) element.

The organic EL element includes a support, a charge-transporting layer including a charge-transporting material disposed on or above the support, and the metal oxide layer disposed on or above the charge-transporting layer. The organic EL element further includes a positive electrode (first electrode), a hole-transporting layer, a light-emitting layer, and a negative electrode (second electrode), and may further include other layers, such as a barrier film.

Note that, a layer including a positive electrode (first electrode), a hole-transporting layer, a light-emitting layer, an electron-transporting layer serving as the charge-transporting layer, and a negative electrode (second electrode) may be referred to as an "organic EL layer."

An example where the electronic device is an organic EL element will be described hereinafter, but the electronic device is not limited to an organic EL element, and may be applied for other embodiments of the electronic device.

Figure 8:
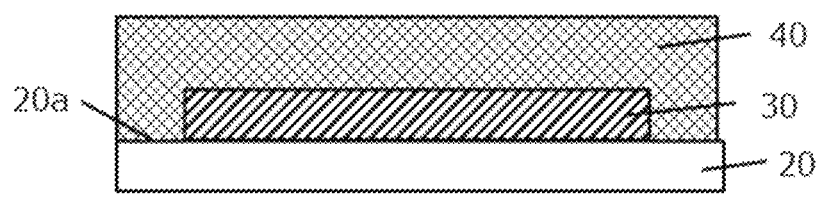
FIG. 8 is a cross-sectional view illustrating one example of the electronic device (organic EL element) of the present disclosure.

FIG. 8 illustrates an organic EL element 10C, which is an embodiment of the electronic device of the present disclosure. The organic EL element having a metal oxide layer at the outermost surface layer of the organic EL layer is provided. The organic EL element 10C includes a substrate 20 serving as a support, an organic EL layer 30, and a metal oxide layer 40.

Note that, the present disclosure is not limited to the embodiments described below. The embodiments described below may be changed, such as another embodiments may be used or additions, corrections, or omissions may be performed in the below-described embodiments within the range with that a person skilled in the art can be arrived, and any of the above-mentioned embodiments are included in the scope of the present disclosure as long as the functions and effects of the present disclosure are exhibited.

<<Support (Substrate)>>

The substrate 20 serving as the support is an insulation substrate. The substrate 20 may be a plastic or film substrate.

A barrier film may be disposed on a main surface 20a of the substrate 20.

The barrier film is, for example, a film formed of silicon, oxygen, and carbon, or a film formed of silica, oxygen, carbon, and nitrogen. Examples of a material of the barrier film include silicon oxide, silicon nitride, and silicon oxynitride. The average thickness of the barrier film is preferably 100 nm or greater but 10 micrometers or less.

<<Organic EL Layer>>

The organic EL layer 30 includes a light-emitting layer, and is a functional part for contributing light emission of a light-emitting layer, such as carrier mobility or carrier recombination according to voltage applied between the positive electrode and the negative electrode. For example, the organic EL layer is formed by laminating a positive electrode, a hole-transporting layer, a light-emitting layer, an electron-transporting layer, and a negative electrode in this order from the side of the support substrate 20.

The organic EL layer 30 is not particularly limited and may be appropriately selected from organic EL elements known in the art depending on the intended purpose.

A transparent electrode is laminated as the negative electrode.

The transparent electrode is formed by using conductive metal oxide, such as $SnO_2$, $In_2O_3$, ITO, IZO, and ZnO:Al. When the transparent electrode is used as a negative electrode, an electron-injecting layer is desirably disposed as the uppermost layer of the organic EL layer to enhance electron injection efficiency. The transparent electrode preferably has transmittance of 50% or greater, more preferably 85% or greater to light having wavelengths of from 400 nm through 800 nm. The average thickness of the transparent electrode is preferably 50 nm or greater, more preferably from 50 nm through 1 micrometer, and even more preferably from 100 nm through 300 nm.

<<Metal Oxide Layer>>

The metal oxide layer 40 of the organic EL element and the production method thereof are appropriately selected from the descriptions of the metal oxide layer of the electronic device of the present disclosure, and the production method thereof.

The metal oxide layer 40 is disposed on the negative electrode to embed the organic EL layer 30 therein. The metal oxide layer 40 is disposed on the organic EL layer 30 opposite to the side where the substrate 20 is disposed. The metal oxide layer 40 has a gas barrier function, particularly a moisture barrier function.

EXAMPLES

The present disclosure will be described in more detail by way of Examples and Comparative Examples. The present disclosure should not be construed as being limited to these Examples. In the descriptions below, "part(s)" denotes "part(s) by mass."

Preparation of Copper Aluminium Oxide

Copper aluminium oxide was prepared in the following manner. Cuprous oxide and alumina were weight to be equal moles. The collected cuprous oxide and alumina were transferred to a mayonnaise bottle, and the mixture therein was stirred by means of a tubular mixer (Type T2C, available from Willy A. Bachofen AG Maschinenfabrik) to obtain a powder mixture. The obtained powder mixture was heated for 40 hours at 1,100 degrees Celsius and the resultant was passed through a sieve having a pore size of 100 micrometers.

<Powder Mixture Material>

Cuprous oxide (NC-803, available from NC TECH Co., Ltd.): 12 kg

Alumina (AA-03, available from SUMITOMO CHEMICAL COMPANY, LIMITED): 8.58 kg

The obtained copper aluminium oxide was pulverized by means of DRYSTAR SDA1 (available from Ashizawa Finetech Ltd.) to obtain a powder of copper aluminium oxide that has the particle sizes at 10% (D10), 50% (D50), and 90% (D90) in the cumulative number of 0.7±0.1 micrometers, 5.0±0.5 micrometers, 26±3 micrometers, respectively. The powder of copper aluminium oxide was vacuum dried at 100 degrees Celsius to adjust a moisture content of the copper aluminium oxide to 0.2% by mass or less.

The particle diameters of the copper aluminium oxide are values obtained by measuring by means of MICROTRAC MT3300 (MicrotracBEL Corp.) using a 0.2% sodium hexametaphosphate aqueous solution as a dispersion medium with a measurement duration of 10 seconds.

As for the moisture content measurement of the copper aluminium oxide, Karl Fischer moisture meter (CA-200, available from Mitsubishi Chemical Analytech Co., Ltd.) was used.

A composition ratio of the elements of the copper aluminium oxide was determined by an X-ray fluorescence spectrometer (ZSX PrimuslV, available from Rigaku Corporation), and the crystal structure was measured by means of an X-ray diffractometer (X'Pert PRO, available from Spectris Co., Ltd.).

Example 1

Production Example of Electrophotographic Photoconductor

Twenty electrophotographic photoconductors of Example 1 were each produced in the following manner. Each electrophotographic photoconductor of Example 1 included an intermediate layer, a charge-generating layer, a charge-transporting layer, a silicone hardcoat layer, and a metal oxide layer disposed on a conductive support in this order.

Formation of Intermediate Layer

The following intermediate coating liquid was applied onto an aluminium conductive support (outer diameter: 100 mm, thickness: 1.5 mm) by dip coating, to form an intermediate layer. After drying for 30 minutes at 150 degrees Celsius, the average thickness of the intermediate layer was 5 micrometers.

<Intermediate Layer Coating Liquid>

Zinc oxide particles (MZ-300, available from TAYCA CORPORATION): 350 parts 3,5-Di-t-butylsalicylic acid (available from Tokyo Chemical Industry Co., Ltd.): 1.5 parts Blocked isocyanate (Sumidur (registered trademark) 3175, solid content: 75% by mass, available from Sumika Bayer Urethane Co., Ltd.): 60 parts Solution obtained by dissolving a butyral resin (20% by mass) in 2-butanone (BM-1, available from SEKISUI CHEMICAL CO., LTD.): 225 parts 2-Butanone: 365 parts Formation of Charge-Generating Layer The following charge-generating layer coating liquid was applied onto the obtained intermediate layer by dip coating, to form a charge-generating layer. The average thickness of the charge-generating layer was 0.2 micrometers.

<Charge-Generating Layer Coating Liquid>

Y-type titanyl phthalocyanine: 6 parts

Butyral resin (S-LEC BX-1, available from SEKISUI CHEMICAL CO., LTD.): 4 parts 2-Butanone (available from KANTO CHEMICAL CO., INC.): 200 parts Formation of Charge-Transporting Layer The following charge-transporting layer coating liquid was applied onto the obtained charge-generating layer by dip coating to form a charge-transporting layer.

After drying for 20 minutes at 135 degrees Celsius, the average thickness of the charge-transporting layer was 22 micrometers.

<Charge-Transporting Layer Coating Liquid>

Bisphenol Z polycarbonate (PANLITE TS-2050, available from TEIJIN LIMITED): 10 parts Low molecular charge-transporting material having the following structural formula: 10 parts

[Chem. 1]

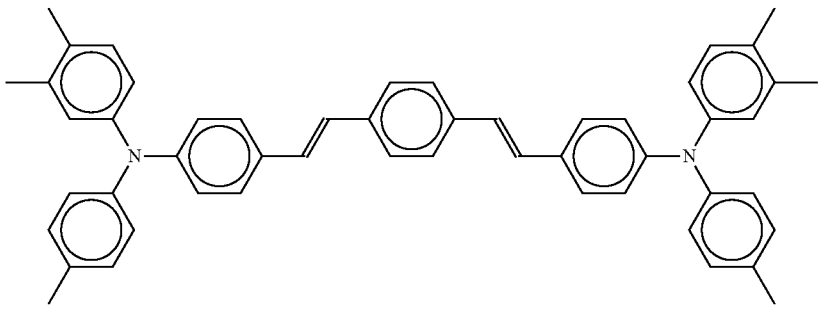

Tetrahydrofuran: 80 parts

—Formation of Silicone Hardcoat Layer—

The following silicone hardcoat layer coating liquid was applied onto the obtained charge-transporting layer by ring coating, to form a silicone hardcoat layer.

After drying for 20 minutes at 135 degrees Celsius, the average thickness of the silicone hardcoat layer was 0.5 micrometers.

(Silicone Hardcoat Layer Coating Liquid)

Silicone hardcoat liquid: (NSC-5506, available from NIPPON FINE CHEMICAL CO., LTD.): 80 parts Tetrahydrofuran: 20 parts Formation of Metal Oxide Layer As a film formation chamber, a chamber obtained by modifying a commercially available vapor deposition device was used.

A commercially available stirrer (T.K. AGI HOMO MIXER 2M-03, available from PRIMIX Corporation) was used for an aerosol generator. Note that, as the aerosol generator, a ultrasonic cleaner (SUS-103, available from Shimadzu Corporation), in which a commercially available pressure-feeding bottle (RBN-S, available from Kato Stainless Kagaku Co.) having a volume of 1 L is disposed, may be used.

A pipe having an inner diameter of 4 mm was drawn from the aerosol generator to the film formation chamber, and an ejection nozzle (YB1/8MSSP37, available from Spraying Systems Co.) was attached at the edge of the pipe. A photoconductor was disposed at the position that was 50 mm apart from the ejection nozzle. As a photoconductor holder, a mechanism that could rotate the photoconductor drum was disposed. As the jet nozzle, a jet nozzle that could laterally move was used. The aerosol generator and a gas cylinder filled with nitrogen were connected with a pipe having an inner diameter of 4 mm.

The targeted metal oxide layer having the average thickness of 1.5 micrometers was produced in the following manner using the above-described device.

The aerosol generator was charged with a powder mixture including the copper aluminium oxide obtained in the above-described manner, and silica particles (Reolosil ZD-30S, available from Tokuyama Corporation), which had been surface treated with dimethyl dichlorosilane and hexamethyldisilazane, had the BET surface area of $190\pm25$ $m^2/g$ and a carbon content of 2.9% by mass at the mass ratio of 99.5%:0.5%.

Next, vacuum drawing was performed from the film formation chamber to the aerosol generator by the exhaust pump. Then, nitrogen gas was sent from the gas cylinder into the aerosol generator, and stirring was initiated to generate an aerosol, in which particles were dispersed in nitrogen gas. The generated aerosol was ejected towards the photoconductor from the jet nozzle via the pipe. The flow rate of the nitrogen gas was from 13 L/min through 20 L/min. Moreover, the film formation duration was 20 minutes, and the degree of vacuum inside the film formation during formation of the metal oxide layer was from about 50 Pa through about 150 Pa.

An amount of the silica particles included at the surface of the photoconductor was determined by an X-ray fluorescence spectrometer (ZSX PrimusIV, available from Rigaku Corporation). The silica particles were included in the photoconductor in the same amount as the charged amount.

Example 2

Twenty electrophotographic photoconductors were produced in the same manner as in Example 1, except that the amount of the silica particles in the powder mixture including the copper aluminium oxide and the silica particles used for forming the metal oxide was changed to 1.0% by mass.

Example 3

Twenty electrophotographic photoconductors were produced in the same manner as in Example 1, except that the amount of the silica particles in the powder mixture including the copper aluminium oxide and the silica particles used for forming the metal oxide was changed to 1.5% by mass.

Example 4

Twenty electrophotographic photoconductors were produced in the same manner as in Example 2, except that the silica particles in the powder mixture including the copper aluminium oxide and the silica particles used for forming the metal oxide layer were changed to silica particles (HDK H-2000, available from Wacker Asahikasei Silicone Co., Ltd.), which had been surface treated with dimethyldichlorosilane, had the BET specific surface area of 200±25 $m^2/g$, and had a carbon content of 2.8% by mass.

Example 5

Twenty electrophotographic photoconductors were produced in the same manner as in Example 2, except that the silica particles in the powder mixture including the copper aluminium oxide and the silica particles used for forming the metal oxide layer were changed to Aerosil R976 (available from NIPPON AEROSIL CO., LTD.), which had been surface treated with dimethyldichlorosilane, had the BET specific surface area of 250±25 $m^2/g$, and had a carbon content of 1.8% by mass.

Example 6

Twenty electrophotographic photoconductors were produced in the same manner as in Example 2, except that the silica particles in the powder mixture including the copper aluminium oxide and the silica particles used for forming the metal oxide layer were changed to Aerosil RA200HS (available from NIPPON AEROSIL CO., LTD.), which had been surface treated with a trimethylsilyl group and an amino group, had the BET specific surface area of 140±25 $m^2/g$, and a carbon content of 1.8% by mass.

Comparative Example 1

Twenty electrophotographic photoconductors were produced in the same manner as in Example 1, except that the silica particles were added in the powder mixture including the copper aluminium oxide and the silica particles for forming the metal oxide layer.

Comparative Example 2

Twenty electrophotographic photoconductors were produced in the same manner as in Example 1, except that the amount of the silica particles in the powder mixture including the copper aluminium oxide and the silica particles used for forming the metal oxide was changed to 0.3% by mass.

Comparative Example 3

Twenty electrophotographic photoconductors were produced in the same manner as in Example 1, except that the amount of the silica particles in the powder mixture including the copper aluminium oxide and the silica particles used for forming the metal oxide was changed to 2.0% by mass.

Example 7

Twenty electrophotographic photoconductors were produced in the same manner as in Example 1, except that a metal oxide layer was formed using a powder mixture including copper aluminium oxide, and aluminium oxide particles (AKP-50, available from SUMITOMO CHEMICAL COMPANY, LIMITED) having the volume average particle diameter of 0.20 micrometers and the BET specific surface area of 10.3 $m^2/g$ at a mass ratio of 99.5%:0.5%.

Example 8

Twenty electrophotographic photoconductors were produced in the same manner as in Example 7, except that the amount of the metal oxide particles in the powder mixture including the copper aluminium oxide and the metal oxide particles used for forming the metal oxide was changed to 1.0% by mass.

Example 9

Twenty electrophotographic photoconductors were produced in the same manner as in Example 7, except that the amount of the metal oxide particles in the powder mixture including the copper aluminium oxide and the metal oxide particles used for forming the metal oxide was changed to 1.5% by mass.

Example 10

Twenty electrophotographic photoconductors were produced in the same manner as in Example 8, except that the metal oxide particles in the powder mixture including the copper aluminium oxide and the metal oxide particles used for forming the metal oxide layer were changed to aluminium oxide (AKP-20, available from SUMITOMO CHEMICAL COMPANY, LIMITED) having the volume average particle diameter of 0.46 micrometers, and the BET specific surface area of 4.3 $m^2/g$.

Example 11

Twenty electrophotographic photoconductors were produced in the same manner as in Example 8, except that the metal oxide particles in the powder mixture including the copper aluminium oxide and the metal oxide particles used for forming the metal oxide layer were changed to TM-DAR (available from TAIMEI CHEMICALS CO., LTD.) having the volume average particle diameter of 0.10 micrometers and the BET specific surface area of 14.5 $m^2/g$.

Example 12

Twenty electrophotographic photoconductors were produced in the same manner as in Example 8, except that the metal oxide particles in the powder mixture including the copper aluminium oxide and the metal oxide particles used for forming the metal oxide layer were changed to SF-10 (available from SAKAI CHEMICAL INDUSTRY CO., LTD.) having the particle diameter of 0.28 micrometers and the BET specific surface area of 11.0 m²/g.

Comparative Example 4

Twenty electrophotographic photoconductors were produced in the same manner as in Example 7, except that the amount of the metal oxide particles in the powder mixture including the copper aluminium oxide and the metal oxide particles used for forming the metal oxide was changed to 0.3% by mass.

Comparative Example 5

Twenty electrophotographic photoconductors were produced in the same manner as in Example 7, except that the amount of the metal oxide particles in the powder mixture including the copper aluminium oxide and the metal oxide particles used for forming the metal oxide was changed to 2.0% by mass.

<Evaluation of Electrophotographic Photoconductor>

In each of the electrophotographic photoconductors of Examples 1 to 12 and Comparative Examples 1 to 5 produced in the above-described manner, a thickness of the cylindrical photoconductor drum having a length 380 mm and the outer diameter of 100 mm was measured at 5 points taken in the longitudinal direction from the position 100 mm away from the edge of the drum to the position 300 mm away from the edge of the drum at the interval of 50 mm. The measurement of the thickness was performed on 20 photoconductor drums to obtain thickness data of 100 points in total. The measurement of the thickness was performed by a method using interference of light according to Japanese Patent No. 5521607. As well as determining a thickness from the average value of the obtained date, a standard deviation was determined.

Based on the obtained average value of the thickness and the standard deviation, a process capability index Cpk was calculated according to the following equations (1) to (3). The results are presented in Table 1. The process capability index is a value evaluating a degree of a shift of the arithmetic average value X of the thickness from the median value of the standard. The larger Cpk means the higher capability of producing photoconductor drums of stable quality.

[Math. 4]
$$Cpk = Cp(1 - K) \quad (1)$$

[Math. 5]
$$Cp = \frac{USL - LSL}{6\sigma} \quad (2)$$

[Math. 6]
$$K = \frac{\left|\left(\frac{USL + LSL}{2}\right) - X\right|}{\left(\frac{USL - LSL}{2}\right)} \quad (3)$$

In the equations above, USL is the upper limit value of the standard, LSL is the lower limit value of the standard, X is the arithmetic average value of the thickness, and $\sigma$ is the standard deviation. Moreover, Cp is a comparison between $6\sigma$ indicating variations in a film formation process, and the standard width.

Since a large number of the photoconductors cannot be measured when an effect of process capability is judged on products on the market, the evaluation can be performed by obtaining measured values of a thickness at 100 points in total with reducing the measurement interval.

TABLE 1

|  | Silica or metal oxide particles | | | | Average film | Standard | | |
| --- | --- | --- | --- | --- | --- | --- | --- | --- |
|  | Type | Amount (mass %) | LSL (μm) | USL (μm) | thickness X (μm) | deviation σ (μm) | Cp | Cpk |
| Ex. 1 | Silica particles (Reolosil ZD-30S) | 0.5 | 1.2 | 1.8 | 1.49 | 0.07 | 1.48 | 1.44 |
| Ex. 2 | Silica particles (Reolosil ZD-30S) | 1.0 | 1.2 | 1.8 | 1.46 | 0.06 | 1.78 | 1.53 |
| Ex. 3 | Silica particles (Reolosil ZD-30S) | 1.5 | 1.2 | 1.8 | 1.53 | 0.07 | 1.53 | 1.39 |
| Ex. 4 | Silica particles (HDK H-2000) | 1.0 | 1.2 | 1.8 | 1.53 | 0.07 | 1.51 | 1.36 |
| Ex. 5 | Silica particles (Aerosil R976) | 1.0 | 1.2 | 1.8 | 1.53 | 0.07 | 1.47 | 1.31 |
| Ex. 6 | Silica particles (Aerosil RA200HS) | 1.0 | 1.2 | 1.8 | 1.53 | 0.07 | 1.36 | 1.23 |
| Comp. Ex. 1 | — | — | 1.2 | 1.8 | 1.54 | 0.13 | 0.75 | 0.65 |
| Comp. Ex. 2 | Silica particles (Reolosil ZD-30S) | 0.3 | 1.2 | 1.8 | 1.55 | 0.09 | 1.17 | 0.96 |
| Comp. Ex. 3 | Silica particles (Reolosil ZD-30S) | 2.0 | 1.2 | 1.8 | 1.53 | 0.10 | 1.01 | 0.92 |
| Ex. 7 | Aluminium oxide particles (AKP-50) | 0.5 | 1.2 | 1.8 | 1.52 | 0.06 | 1.75 | 1.67 |
| Ex. 8 | Aluminium oxide particles (AKP-50) | 1.0 | 1.2 | 1.8 | 1.49 | 0.06 | 1.79 | 1.73 |
| Ex. 9 | Alumimium oxide particles (AKP-50) | 1.5 | 1.2 | 1.8 | 1.53 | 0.06 | 1.79 | 1.64 |
| Ex. 10 | Aluminium oxide particles (AKP-20) | 1.0 | 1.2 | 1.8 | 1.50 | 0.06 | 1.64 | 1.61 |

TABLE 1-continued

| | Silica or metal oxide particles | | | | Average film | Standard | | |
|---|---|---|---|---|---|---|---|---|
| | Type | Amount (mass %) | LSL (μm) | USL (μm) | thickness X (μm) | deviation σ (μm) | Cp | Cpk |
| Ex. 11 | Aluminium oxide particles (TM-DAR) | 1.0 | 1.2 | 1.8 | 1.51 | 0.06 | 1.61 | 1.59 |
| Ex. 12 | Zinc oxide particles (SF-10) | 1.0 | 1.2 | 1.8 | 1.51 | 0.06 | 1.59 | 1.56 |
| Comp. Ex. 4 | Aluminium oxide particles (AKP-50) | 0.3 | 1.2 | 1.8 | 1.51 | 0.09 | 1.15 | 1.11 |
| Comp. Ex. 5 | Aluminium oxide particles (AKP-50) | 2.0 | 1.2 | 1.8 | 1.50 | 0.10 | 1.02 | 1.02 |

It was found from the results of Table 1 that the metal oxide layer in each of the electrophotographic photoconductors obtained in Examples 1 to 12 had less unevenness in the thickness thereof.

It was found that the high Cpk was obtained when the amount of the silica particles in the powder mixture including the copper aluminium oxide and the silica particles used for the metal oxide layer was changed from 0.5% by mass of Example 1 to 1.5% by mass of Example 3.

Moreover, it was found that the high Cpk was obtained when the amount of the metal oxide particles in the powder mixture including the copper aluminium oxide and the metal oxide particles used for the metal oxide layer was changed from 0.5% by mass of Example 7 to 1.5% of Example 9. For Example, Embodiments of the Present Disclosures are as Follows:

<1> An electronic device including:
a support;
a charge-transporting layer including a charge-transporting material, or a sensitizing-dye electrode layer including a sensitizing dye, where the charge-transporting layer or the sensitizing dye electrode layer is disposed on or above the support; and
a metal oxide layer disposed on or above the charge-transporting layer or the sensitizing-dye electrode layer,
wherein the metal oxide layer includes p-type semiconductor metal oxide and silica or metal oxide particles, and
wherein an amount of the silica or metal oxide particles included in the metal oxide layer is 0.5% by mass or greater but 1.5% by mass or less relative to the metal oxide layer.
<2> The electronic device according to <1>,
wherein an average thickness of the metal oxide layer is 1.2 micrometers or greater but 1.8 micrometers or less, and a standard deviation of a thickness of the metal oxide is 0.07 micrometers or less.
<3> The electronic device according to <1> or <2>,
wherein the p-type semiconductor metal oxide is delafossite oxide.
<4> The electronic device according to <3>,
wherein the delafossite oxide is copper aluminium oxide.
<5> A method for producing an electronic device, the method including:
spraying p-type semiconductor metal oxide and silica or metal oxide particles to form a metal oxide layer,
wherein the electronic device includes:
a support;
a charge-transporting layer including a charge-transporting material or a sensitizing-dye electrode layer including a sensitizing dye, where the charge-transporting layer or the sensitizing-dye electrode layer is disposed on or above the support; and
the metal oxide layer disposed on or above the charge-transporting layer or the sensitizing-dye electrode layer.
<6> The method according to <5>,
wherein the spraying is aerosol deposition.
<7> An image forming method including:
forming an image using the electrochromic device according to any one of <1> to <4>.
<8> An image forming apparatus including:
the electrochromic device according to any one of <1> to <4>.

The electronic device according to any one of <1> to <4>, the method for producing an electronic device according to <5> or <6>, the image forming method according to <7>, and the image forming apparatus according to <8> can solve the above-described various problems existing in the art, and can achieve the object of the present disclosure.

REFERENCE SIGNS LIST

1A: charge eliminating device
1B: pre-cleaning exposing device
1C: driving unit
1D: first transferring device
1E: second transferring device
1F: intermediate transfer member
1G: conveying transfer belt
3: lubricant coating device
3A: lubricant
3B: coating brush
3C: coating blade
3D: press spring
10A: electrostatic latent image bearer (electrophotographic photoconductor)
10B: solar cell
10C: organic electroluminescent element
11, 11Bk, 11C, 11M, 11Y: electrophotographic photoconductor
12, 12Y, 12M, 12C, 12Bk: charging device
13, 13Y, 13M, 13C, 13Bk: exposing device
14, 14Bk, 14C, 14M, 14Y: developing device
15: toner
16, 16Y, 16M, 16C, 16Bk: transferring device
17, 17Y, 17M, 17C, 17Bk: cleaning device
18: print media
19: fixing device

The invention claimed is:

1. An electronic device, comprising:
   a support;
   a charge-transporting layer including a charge-transporting material, or a sensitizing-dye electrode layer including a sensitizing dye, where the charge-transporting layer or the sensitizing dye electrode layer is disposed on or above the support; and
   a metal oxide layer disposed on or above the charge-transporting layer or the sensitizing-dye electrode layer,
   wherein the metal oxide layer includes p-type semiconductor metal oxide and silica or p-type semiconductor metal oxide and metal oxide particles,
   an amount of the silica or metal oxide particles included in the metal oxide layer is 0.5% by mass or greater but 1.5% by mass or less relative to a total mass of the metal oxide layer,
   the p-type semiconductor metal oxide is delafossite oxide which is copper aluminium oxide.

2. The electronic device according to claim 1, wherein an average thickness of the metal oxide layer is 1.2 micrometers or greater but 1.8 micrometers or less, and a standard deviation of a thickness of the metal oxide layer is 0.07 micrometers or less.

3. A method for producing an electronic device, the method comprising:
   spraying p-type semiconductor metal oxide and silica or p-type semiconductor metal oxide and metal oxide particles to form a metal oxide layer,
   wherein the electronic device includes:
   a support;
   a charge-transporting layer including a charge-transporting material or a sensitizing-dye electrode layer including a sensitizing dye, where the charge-transporting layer or the sensitizing-dye electrode layer is disposed on or above the support; and
   the metal oxide layer disposed on or above the charge-transporting layer or the sensitizing-dye electrode layer.

4. The method according to claim 3, wherein the spraying is aerosol deposition.

5. An image forming method, comprising:
   forming an image using the electronic device according to claim 1.

6. An image forming apparatus, comprising:
   the electronic device according to claim 1.

* * * * *